(12) United States Patent
Ogi et al.

(10) Patent No.: US 8,873,289 B2
(45) Date of Patent: Oct. 28, 2014

(54) NONVOLATILE SEMICONDUCTOR MEMORY DEVICE

(71) Applicant: Kabushiki Kaisha Toshiba, Minato-ku (JP)

(72) Inventors: Jun Ogi, Yokohama (JP); Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/019,810

(22) Filed: Sep. 6, 2013

(65) Prior Publication Data

US 2014/0219024 A1 Aug. 7, 2014

Related U.S. Application Data

(60) Provisional application No. 61/760,714, filed on Feb. 5, 2013.

(51) Int. Cl.
*G11C 16/00* (2006.01)
*G11C 16/04* (2006.01)

(52) U.S. Cl.
CPC ........ *G11C 16/0408* (2013.01); *G11C 16/0483* (2013.01)
USPC ................... 365/185.11; 365/63; 365/185.17

(58) Field of Classification Search
CPC .................. G11C 16/0483; G11C 16/0433
USPC .............. 365/185.11, 185.17, 185.05, 63, 72
See application file for complete search history.

(56) References Cited

U.S. PATENT DOCUMENTS

| | | | | |
|---|---|---|---|---|
| 5,568,421 | A | * | 10/1996 | Aritome .................... 365/185.17 |
| 5,680,347 | A | * | 10/1997 | Takeuchi et al. .......... 365/185.17 |
| 6,028,788 | A | | 2/2000 | Choi et al. |
| 7,411,825 | B2 | | 8/2008 | Kutsukake et al. |
| 8,059,461 | B2 | * | 11/2011 | Lee ............................ 365/185.11 |

FOREIGN PATENT DOCUMENTS

| | | |
|---|---|---|
| JP | 4-58134 | 9/1992 |
| JP | 11-186528 | 7/1999 |
| JP | 4113211 | 4/2008 |

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

Word lines extend in a first direction and are commonly connected to memory cells in a plurality of NAND cell units. Bit lines extend in a second direction crossing to the first direction and connected to one ends of the NAND cell units. In one block, both a first and a second NAND cell unit are connected to one of the bit lines. A bit-line-side select transistor in the first NAND cell unit and a source-line-side select transistor in the second NAND cell unit are disposed adjacently to each other. The source-line-side select transistor in the first NAND cell unit and the bit-line-side select transistor in the second NAND cell unit are disposed adjacently to each other.

17 Claims, 32 Drawing Sheets

NONVOLATILE SEMICONDUCTOR MEMORY DEVICE

CROSS REFERENCE TO RELATED APPLICATIONS

This application is based on and claims the benefit of priority from prior U.S. prior provisional Patent Application No. 61/760,714, filed on Feb. 5, 2013, the entire contents of which are incorporated herein by reference.

FIELD

Embodiments described in the present specification relate to a nonvolatile semiconductor memory device.

BACKGROUND

Conventionally, a NAND type flash memory is known as an example of a nonvolatile semiconductor memory device. A memory cell array in a NAND type flash memory is configured as an arrangement of a plurality of NAND cell units, each of the NAND cell units having a plurality of memory cells connected in series therein.

In such a NAND type flash memory, along with reduction in array pitch of the NAND cell unit, there is a need to reduce also wiring pitch of bit lines. However, because processing is difficult, a withstand voltage thereof deteriorates, an RC delay due to an increase in wiring resistance and wiring capacitance increases, and for the other reasons, it is difficult to conform reduction in wiring pitch of the bit lines with reduction in array pitch of the NAND cell unit.

Therefore, a system where two NAND cell units aligned in a word line direction share one bit line (shared bit line system) is also known. However, in this shared bit line system, a plurality of select transistors must be provided at one end of the NAND cell unit, which has been a barrier to improvement of bit density in the memory cell array.

DETAILED DESCRIPTION

A semiconductor memory device in an embodiment described below comprises a memory cell array configured having NAND cell units arranged therein, each of the NAND cell units including a memory string and a bit-line-side select transistor and source-line-side select transistor that are connected respectively to the two ends of the memory string, the memory string being configured having a plurality of memory cells connected in series therein, each of the memory cells being configured capable of storing data in a nonvolatile manner. Word lines extend in a first direction and are commonly connected to the memory cells in a plurality of the NAND cell units. Bit lines extend in a second direction crossing to the first direction and connected to one ends of the NAND cell units. In one block, both a first and a second NAND cell units are connected to one of the bit lines. The bit-line-side select transistor in the first NAND cell unit and the source-line-side select transistor in the second NAND cell unit are disposed adjacently to each other. The source-line-side select transistor in the first NAND cell unit and the bit-line-side select transistor in the second NAND cell unit are disposed adjacently to each other.

Next, embodiments of the present invention are described in detail with reference to the drawings.

[First Embodiment]
(Circuit Configuration)

Figure 1:
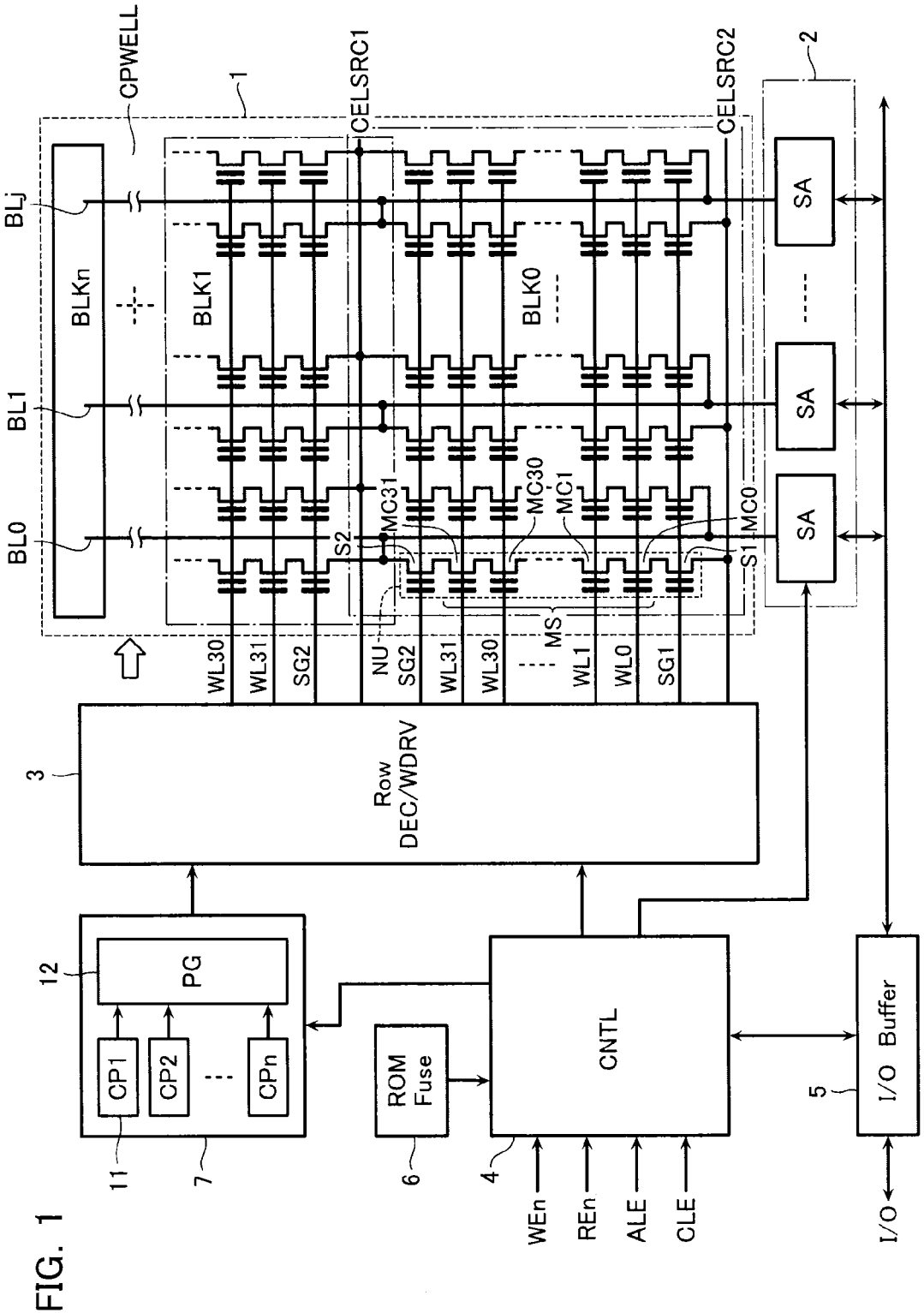
FIG. 1 is a block diagram of a nonvolatile semiconductor memory device according to a first embodiment.

FIG. 1 is a block diagram of a nonvolatile semiconductor memory device (NAND type flash memory) according to a first embodiment. As shown in FIG. 1, the nonvolatile semiconductor memory device includes a memory cell array 1, a sense amplifier circuit 2, a row decoder 3, a controller 4, an input/output buffer 5, a ROM fuse 6, and a voltage generating circuit 7.

The memory cell array 1 includes a plurality of NAND cell units NU arranged in a matrix. One NAND cell unit NU is configured by: a memory string MS configured from a plurality of (in this example, 32) memory cells MC (MC0, MC1, . . . , MC31) connected in series; and select transistors S1 and S2 connected to both ends of this memory string MS. Moreover, in this memory cell array 1, bit lines BL are arranged having a column direction as a long direction, and word lines WL0 to WL31 and select gate lines SG1 and SG2 are arranged having a row direction as a long direction. In addition, two source lines CELSRC1 and CELSRC2 are connected per one block.

Control gates of the 32 memory cells MC in one NAND cell unit NU are each connected to different word lines WL (WL0, WL1, . . . , WL31). Gates of the select transistors S1 and S2 are connected respectively to select gate lines SG1 and SG2 parallel to the word lines WL.

Some of the select transistors S1 are connected to the bit line BL to function as a bit-line-side select transistor, and the other select transistors S1 are connected to the source line CELSRC1 or CELSRC2 to function as a source-line-side select transistor. Similarly, some of the select transistors S2 are connected to the bit line BL to function as a bit-line-side select transistor, and the other select transistors S2 are connected to the source line CELSRC1 or CELSRC2 to function as a source-line-side select transistor. This will be described in detail later.

Note that a dummy cell not employed for information storage may be included at an end of the memory string MS. The dummy cell can be positioned at both ends of the memory string MS and may be configured having a structure identical to that of the memory cell MC.

Although not illustrated in the drawings, as is well known, one memory cell MC can be configured to include a floating gate electrode acting as a charge storage layer, on a gate insulating film (tunnel insulating film) formed between a drain and a source, and to have a control gate electrode formed on that floating gate electrode via an inter-gate insulating film. The control gate is connected to one of the word lines WL.

Note that in this embodiment, the select transistors S1 and S2 also, similarly to the memory cells, are configured to include a floating gate electrode, acting as a charge storage layer, on a gate insulating film (tunnel insulating film), and to have a control gate electrode formed on that floating gate electrode via an inter-gate insulating film. That is, similarly to the memory cells MC, the select transistors S1 and S2 can have their threshold voltage changed according to an amount of charge stored in the floating gate electrode (in other words, the select transistors S1 and S2 are configured rewritable, similarly to the memory cells MC). A set of the plurality of memory cells MC sharing one word line WL configures one page or a plurality of pages. A set of the plurality of NAND cell units NU sharing the word lines WL and select gate lines SG1 and SG2 configures a block BLK which is a unit of data erase.

As shown in FIG. 1, the memory cell array 1 includes a plurality of blocks BLK (BLK0, BLK1, . . . , BLKn) arranged in a direction that the bit lines BL extend. Adjacent blocks BLK (for example, BLK0 and BLK1) have a structure which is symmetrical in a direction that the word lines extend, and share a source line contact and a bit line contact between those adjacent blocks BLK. The memory cell array 1 including these plurality of blocks BLK is formed in one cell well CPWELL of a silicon substrate.

The sense amplifier circuit 2 is connected to the plurality of bit lines BL in the memory cell array 1. The sense amplifier circuit 2 includes a plurality of sense amplifiers SA. Each of the sense amplifiers SA is connected to a respective one of the bit lines BL, and configures a page buffer for sensing read data and holding write data. The row decoder 3 selects and drives the word lines WL and select gate lines SG1 and SG2.

The data input/output buffer 5, in addition to performing data exchange between the sense amplifier circuit 2 and an external input/output terminal, receives command data and address data. The controller 4 receives an external control signal such as a write enable signal WEn, a read enable signal REn, an address latch enable signal ALE, a command latch enable signal CLE, and so on, to perform overall control of memory operations. Specifically, the controller 4 performs a read operation, a write operation, and an erase operation mentioned later.

Specifically, the controller 4 includes a command interface, address holding/transferring circuit, or the like, and judges whether supplied data is write data or address data. Based on this judgment result, write data is transferred to the sense amplifier circuit 2, and address data is transferred to the row decoder 3 or sense amplifier circuit 2. In addition, the controller 4 performs sequence control of read/write/erase control of an applied voltage, and so on, based on an external control signal. The controller 4 has programs for executing these various kinds of operations built in.

The voltage generating circuit 7 includes a plurality of boost circuits 11 and a pulse generating circuit 12. The boost circuits 11 may each be configured from well-known charge pump circuits CP1, CP2, . . . , CPn. The voltage generating circuit 7 switches the number of boost circuits 11 that are driven, based on a control signal from the controller 4, and thereby generates a desired pulse voltage.

Figure 2:
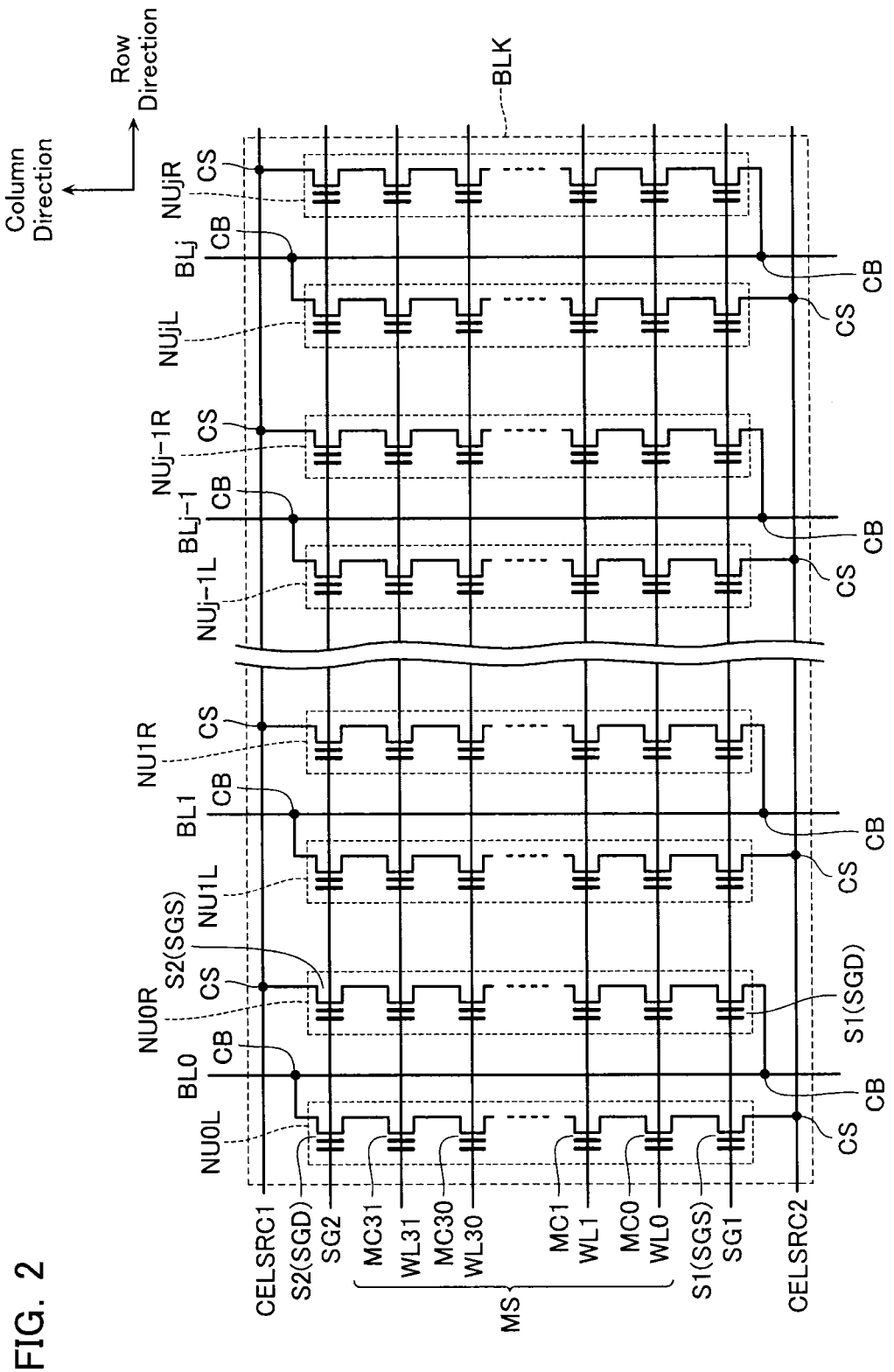
FIG. 2 is a circuit diagram of one block BLK in a memory cell array 1 shown in FIG. 1.

Next, a circuit diagram of one block BLK of the memory cell array 1 will be described with reference to FIG. 2. As shown in FIG. 2, this embodiment adopts a shared bit line system where two NAND cell units NUiL and NUiR adjacent in a long direction of the word lines WL in one block (row direction) are connected to one bit line BLi (i=0, 1, 2, . . . , j) (in other words, this embodiment adopts a system where two NAND cell units NUiR and NUiL adjacent to each other in one block BLK share one bit line BLi). Such a shared bit line system enables wiring pitch of the bit line BLi to be made larger than array pitch of the NAND cell unit, with the result that line width of the bit line BL can be thickened, lowering of bit line current can be prevented, and read speed can be quickened.

The two NAND cell units NUiR and NUiL shared by one bit line BLi are connected alternately. More specifically, the NAND cell unit NUiR disposed on the right side of the bit line BLi is connected to the bit line BLi in a first portion (lower side of FIG. 2) of one block BLKi, and extends toward a second portion in an opposite direction to this first portion (upper side of FIG. 2) of one block BLKi. Now, in this specification, "first portion" is assumed to refer to one of the portions formed when one block BLK is divided into two in the column direction, and "second portion" is assumed to refer to the other of the portions. In the NAND cell unit NUiR, the select transistor S1 is connected to the bit line BLi via a bit line contact CB to function as a bit-line-side select transistor SGD, and the select transistor S2 is connected to the source line CELSRC1 via a source line contact CS to function as a source-line-side select transistor SGS.

On the other hand, the NAND cell unit NUiL disposed on the left side of the bit line BLi is connected to the bit line BLi in the second portion (upper side of FIG. 2) of one block BLKi via the bit line contact CB, and extends toward this first portion (lower side of FIG. 2) of one block BLKi. In the NAND cell unit NUiL, the select transistor S2 is connected to the bit line BLi to function as a drain select transistor SGD, and the select transistor S1 is connected to the source line CELSRC1 via the source line contact CS to function as the source-line-side select transistor SGS. Therefore, the source side select transistor SGS of the NAND cell unit NUiL and the drain side select transistor SGD in the NAND cell unit NUiR are disposed adjacently to each other, and, moreover, are connected to the identical select gate line SG1. Similarly, the drain side select transistor SGD of the NAND cell unit NUiL and the source side select transistor SGS in the NAND cell unit NUiR are disposed adjacently to each other, and, moreover, are connected to the identical select gate line SG2.

The select gate line SG1 is commonly connected to gates of the plurality of select transistors S1 arranged in a line in the row direction. On the other hand, the select gate line SG2 is commonly connected to gates of the plurality of select transistors S2 arranged in a line in the row direction.

The select transistors S1 and S2 are capable of having their threshold voltages changed by executing a write operation, and executing this write operation makes it possible to execute various kinds of operations in the nonvolatile semiconductor memory device of the present embodiment. The write operation to the select transistors S1 and S2 will be described in detail later.

The memory cell array 1 has the NAND cell units NU arranged and connected in the above manner. Therefore, in the memory cell array 1, the NAND cell units connected to the bit line BL in the first portion of the block BLK and the NAND cell units connected to the bit line BL in the second portion of the block BLK are arranged alternately in one-by-one basis in the row direction.

Figure 3:
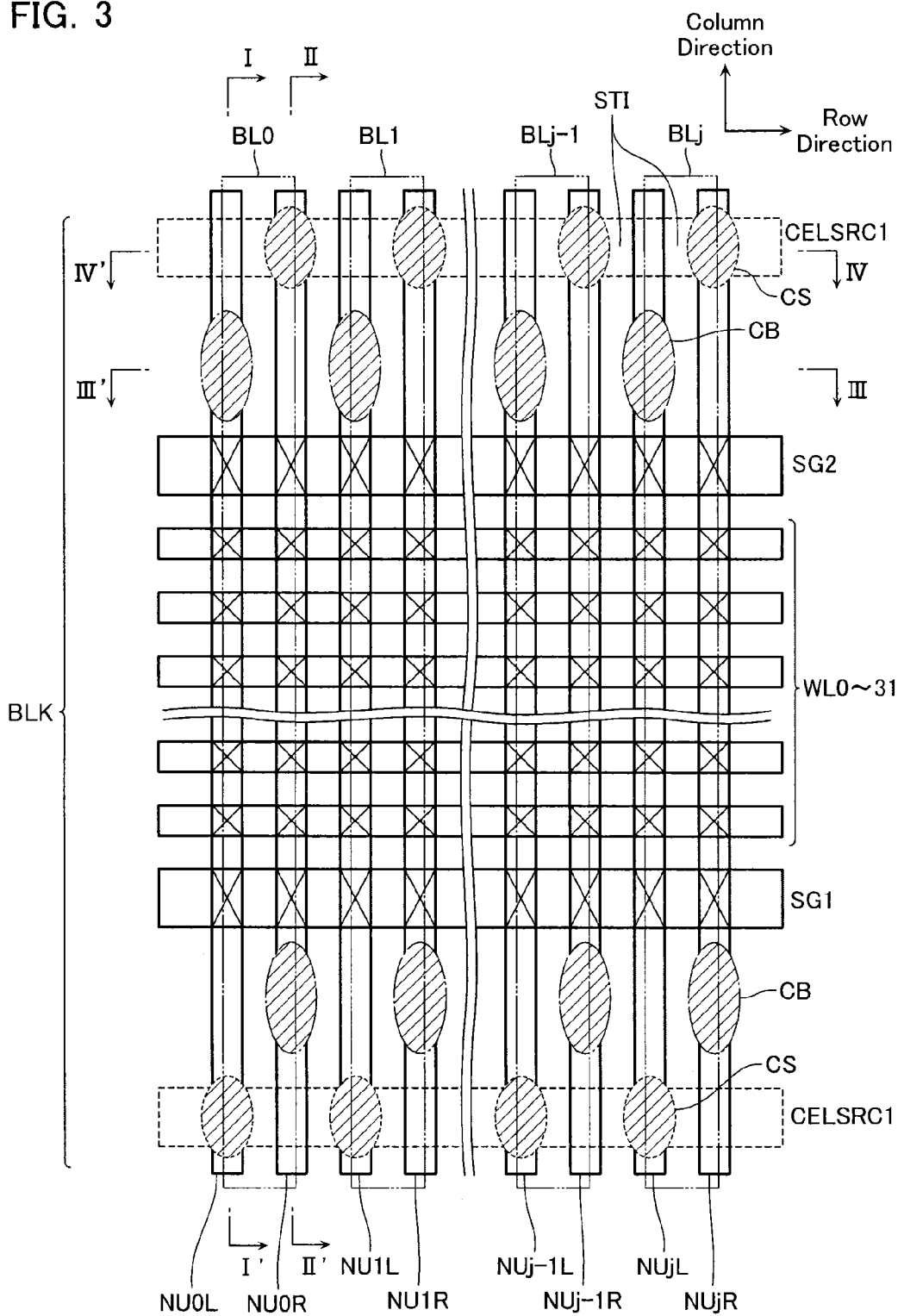
FIG. 3 is a planar surface layout view of one block BLK in the memory cell array 1 of the first embodiment.

Next, an actual structure of the memory cell array 1 of the first embodiment will be described with reference to FIGS. 3 to 7. FIG. 3 is a planar surface layout view of one block BLK in the memory cell array 1 of this embodiment. In addition, FIGS. 4 to 7 are cross-sectional views taken along the lines I-I', II-II', III-III', and IV-IV', respectively, in FIG. 3. As shown in FIGS. 3 and 6, a trench having the column direction as a long direction is formed with equal spacing in the row direction in a semiconductor substrate, and this trench is filled in with an insulating film of a silicon oxide film or the like to form an insulating separation film STI. The remaining striped semiconductor substrate forms an active area AA, and the previously mentioned NAND cell unit NU is formed in this active area AA. The word lines WL0 to WL31 and the select gate lines SG1 and SG2 are formed having the row direction as a long direction, so as to be orthogonal to the active area AA which is formed having the column direction as a long direction. The word lines WL0 to WL31 and the select gate lines SG1 and SG2 are formed having, for example, polysilicon as a material. The word lines WL0 to WL31 and the select gate lines SG1 and SG2 are formed sandwiching a tunnel insulating film TOX, a floating gate FG, and an inter-gate insulating film IOX between the word lines and select gate lines and the active area AA. The word lines WL0 to WL31 and the select gate lines SG1 and SG2 function as control gates CG of the memory cells MC and the select transistors S1 and S2, respectively. Note that the tunnel insulating film TOX and the inter-gate insulating film IOX may be formed having, for example, a silicon oxide film as a material. Moreover, the floating gate FG may be formed having, for example, polysilicon as a material.

Figure 4:
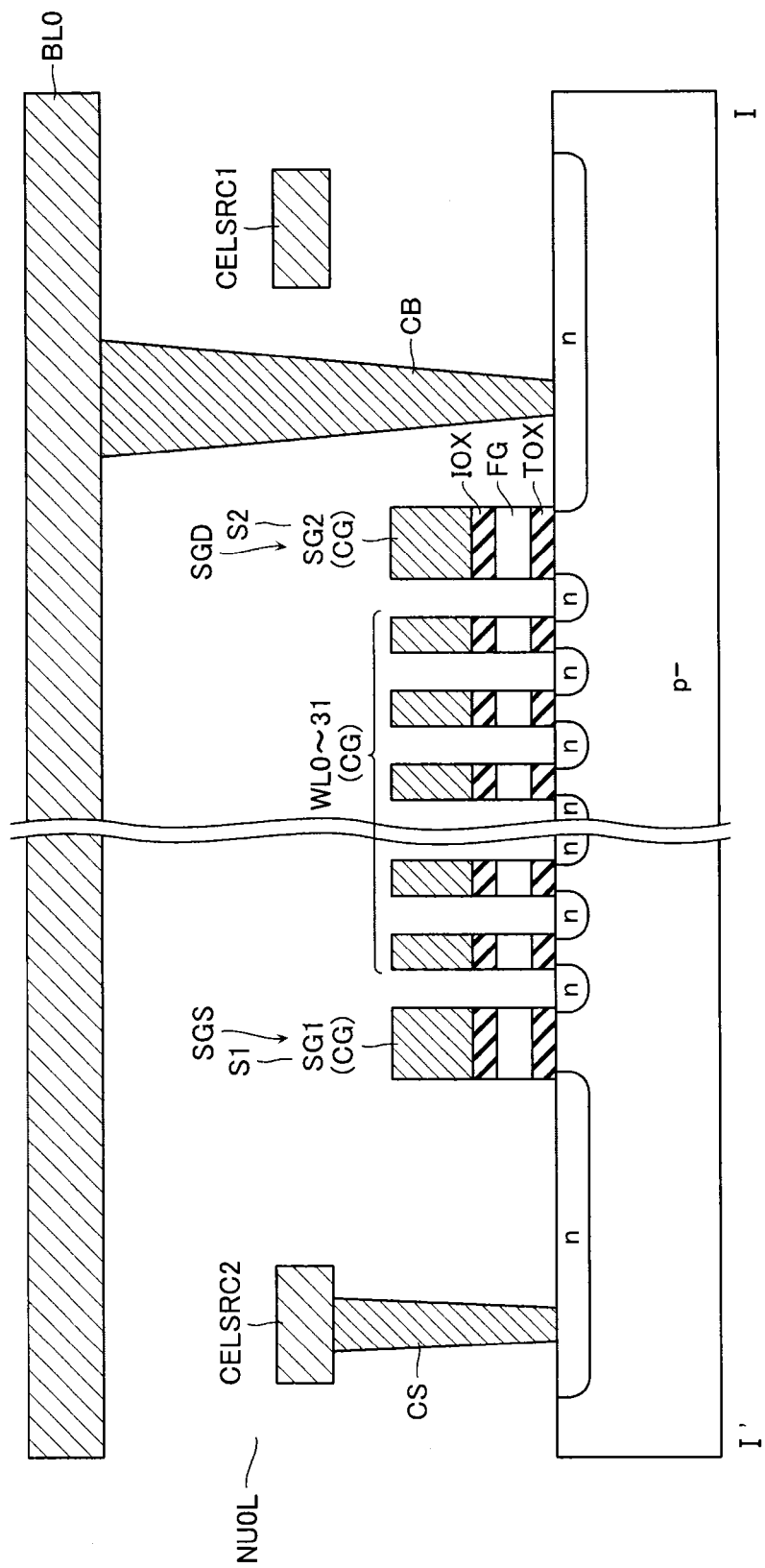
FIG. 4 is a cross-sectional view taken along the line I-I' in FIG. 3.
Figure 5:
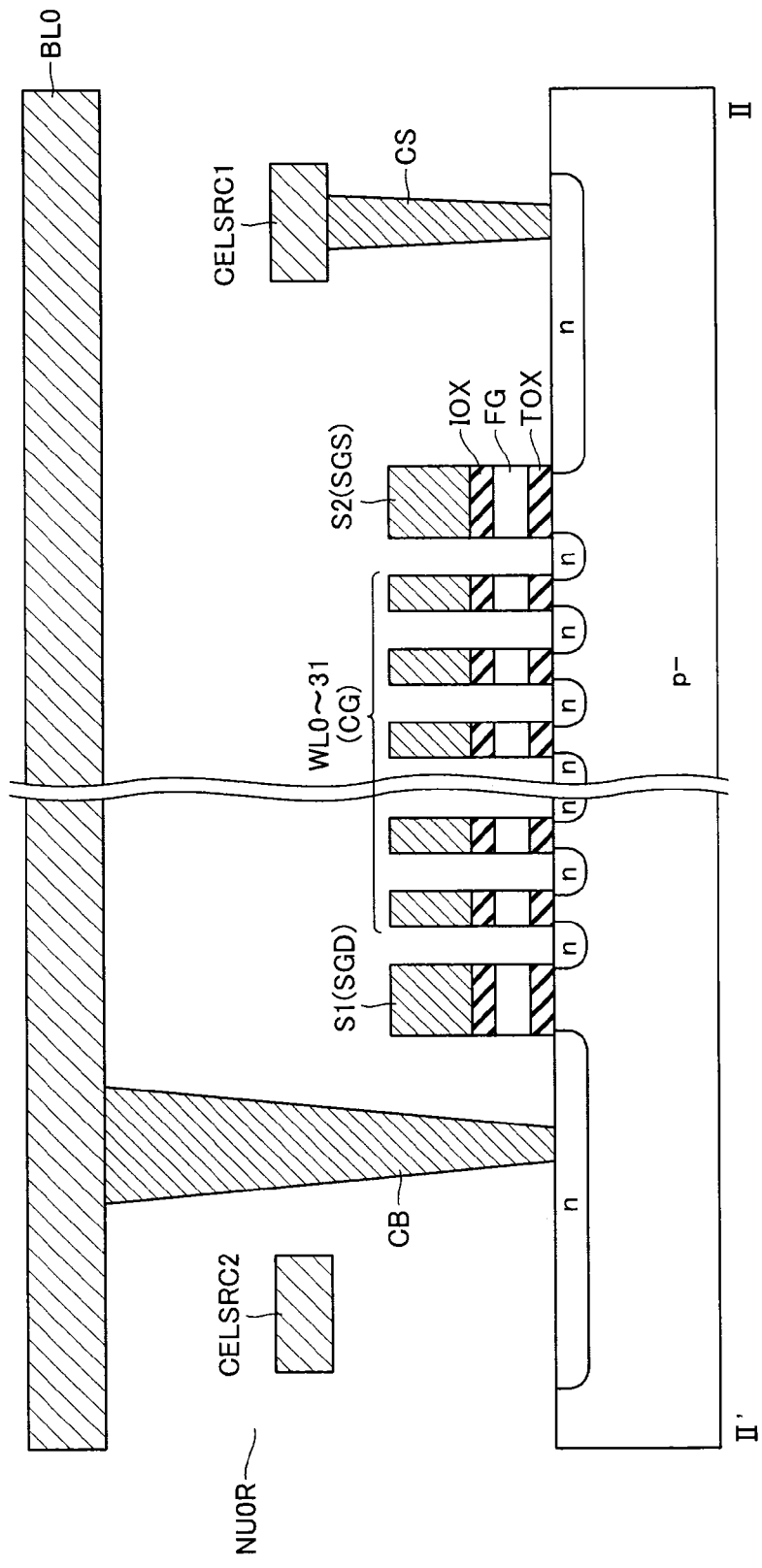
FIG. 5 is a cross-sectional view taken along the line II-II' in FIG. 3.
Figure 6:
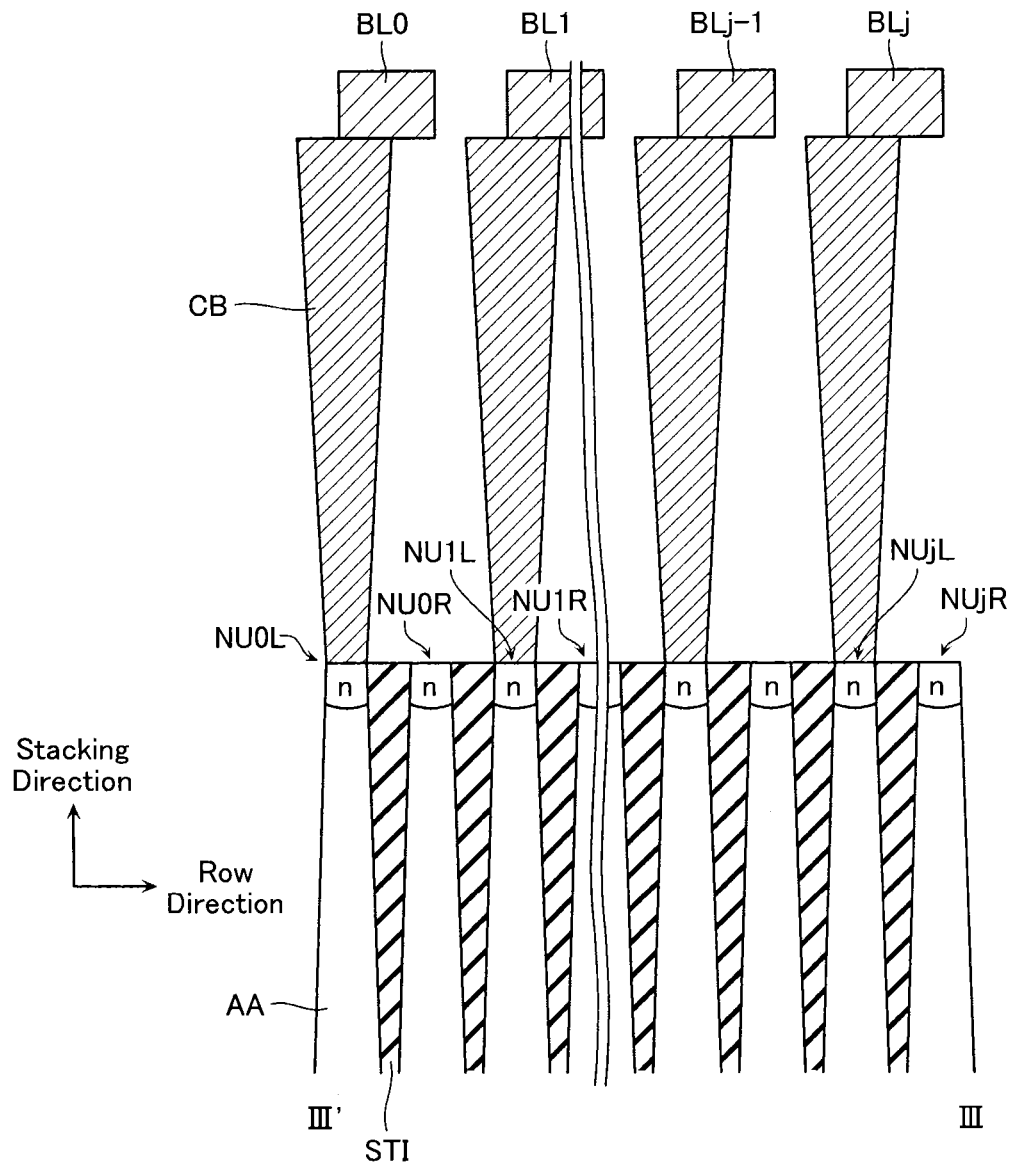
FIG. 6 is a cross-sectional view taken along the line III-III' in FIG. 3.

As shown in FIGS. 4 and 5, the structure itself of the NAND cell unit NU is substantially similar to a conventional structure. That is, a gate electrode of the memory cells MC and the select transistors S1 and S2 is formed by a stacked structure of the tunnel insulating film TOX, the floating gate FG, the inter-gate insulating film IOX, and the control gate CG (word lines WL and select gate lines SG1 and SG2). Moreover, formed on both sides of these gate electrode structures is an n type diffusion layer acting as a drain and a source of the memory cells MC and the select transistors S1 and S2. Note that in FIG. 3, a size of the contacts CB and CS indicates a size in a planar surface direction of an upper end of each of the contacts CB and CS. As mentioned later, the bit line BL is positioned in a higher layer than the source lines CELSRC1 and CELSRC2. Therefore, the size of the upper end of the contact CB is formed larger than the size of the upper end of the contact CS. When viewed in the same cross-section, the size of both contacts may be substantially identical.

FIG. 4 is a cross-sectional view of part of the NAND cell unit NU0L connected to the left side of the bit line BL0. As shown in FIG. 4, the source line CELSRC2 is connected to the source of the select transistor S1 in the NAND cell unit NU0L via the source line contact CS. In addition, the bit line BL0 is connected to the drain of the select transistor S2 via the bit line contact CB. The bit line BL0 is formed in a higher layer than the source lines CELSRC1 and CELSRC2. The same applies also to the other bit lines BL1 to BLj.

FIG. 5 is a cross-sectional view of the NAND cell unit NU0R connected to the right side of the bit line BL0. As previously mentioned, whereas the NAND cell unit NU0L is formed connected to the bit line BL0 in the second portion and extending toward the first portion, the NAND cell unit NU0R is, on the other hand, formed connected to the bit line BL0 in the first portion and extending toward the second portion. That is, as shown in FIG. 5, the bit line BL0 is connected to the drain of the select transistor S1 in the NAND cell unit NU0R via the bit line contact CB. In addition, the source line CELSRC1 is connected to the source of the select transistor S2 via the source line contact CS.

FIG. 6 is a cross-sectional view taken along the line III-III' in FIG. 3, and is a cross-sectional view of the bit line contact CB connected to the NAND cell unit NUiL. As shown in FIG. 6, the bit line BL has a large wiring pitch compared to the active area AA where the NAND cell unit NU is formed. Moreover, the bit line contact CB extending in a stacking direction (direction perpendicular to the substrate) from the active area AA where the NAND cell unit NUiL is formed is connected to a left side of the bit line BLi. Note that, although not illustrated in the drawings, the bit line contact CB connected to the NAND cell unit NUiR also has a substantially similar structure (refer to FIG. 3). However, the bit line contact CB connected to the NAND cell unit NUiR differs from FIG. 6 in being connected to a right side of the bit line BLi.

Figure 7:
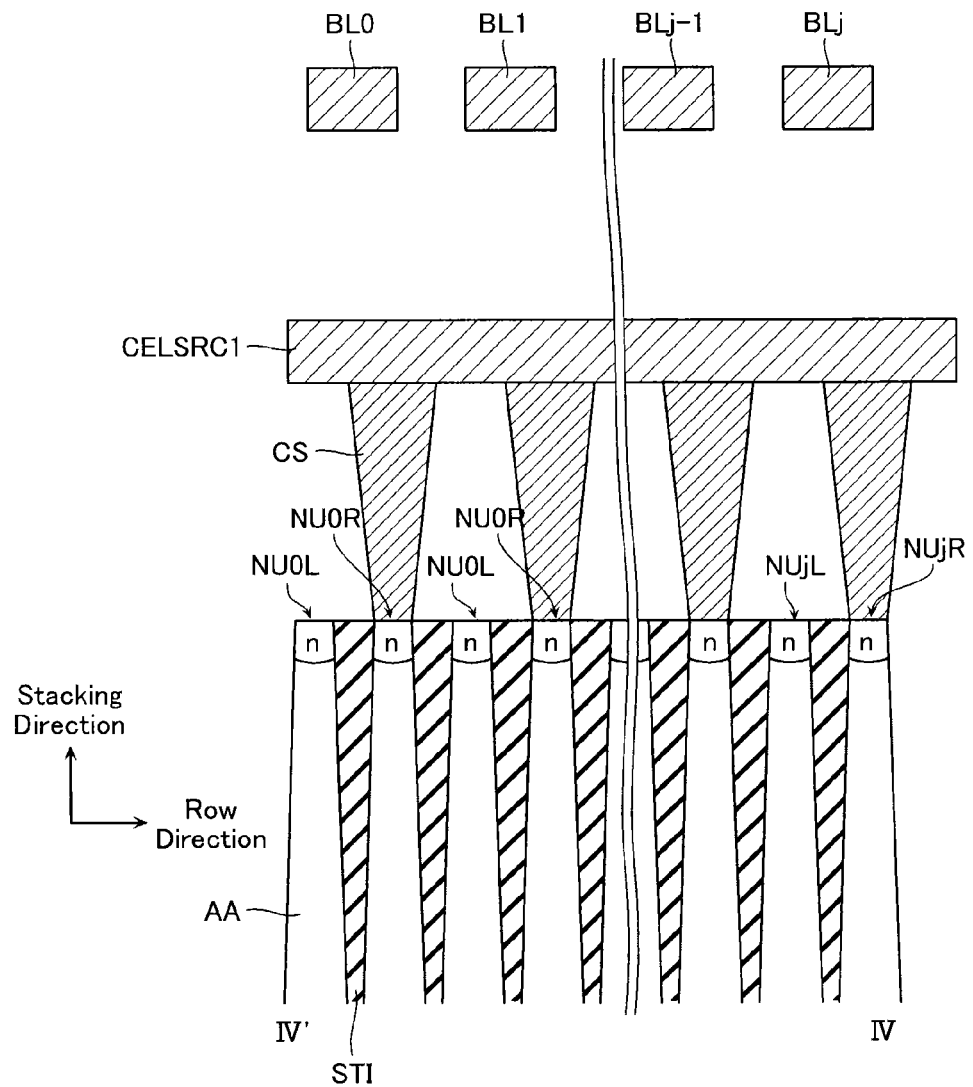
FIG. 7 is a cross-sectional view taken along the line IV-IV' in FIG. 3.

FIG. 7 is a cross-sectional view taken along the line IV-IV' in FIG. 3, and is a cross-sectional view of the source line contact CS connected to the NAND cell unit NUiR. The source line contact CS extending from the active area AA where the NAND cell unit NUiR is formed is connected to the source line CELSRC1. Note that, although not illustrated in the drawings, the source line contact CS connected to the NAND cell unit NUiL is also substantially similarly connected to the source line CELSRC2 (refer to FIG. 3).

Note that, as shown in FIG. 3, the contacts CB and CS are disposed staggered (in a zigzag shape) alternately in one-by-one basis in the row direction. This is to avoid the bit line contact CB connecting to the source lines CELSRC1 and CELSRC2.

(Threshold Voltage Change Operation of Select Transistor)

Figure 8:
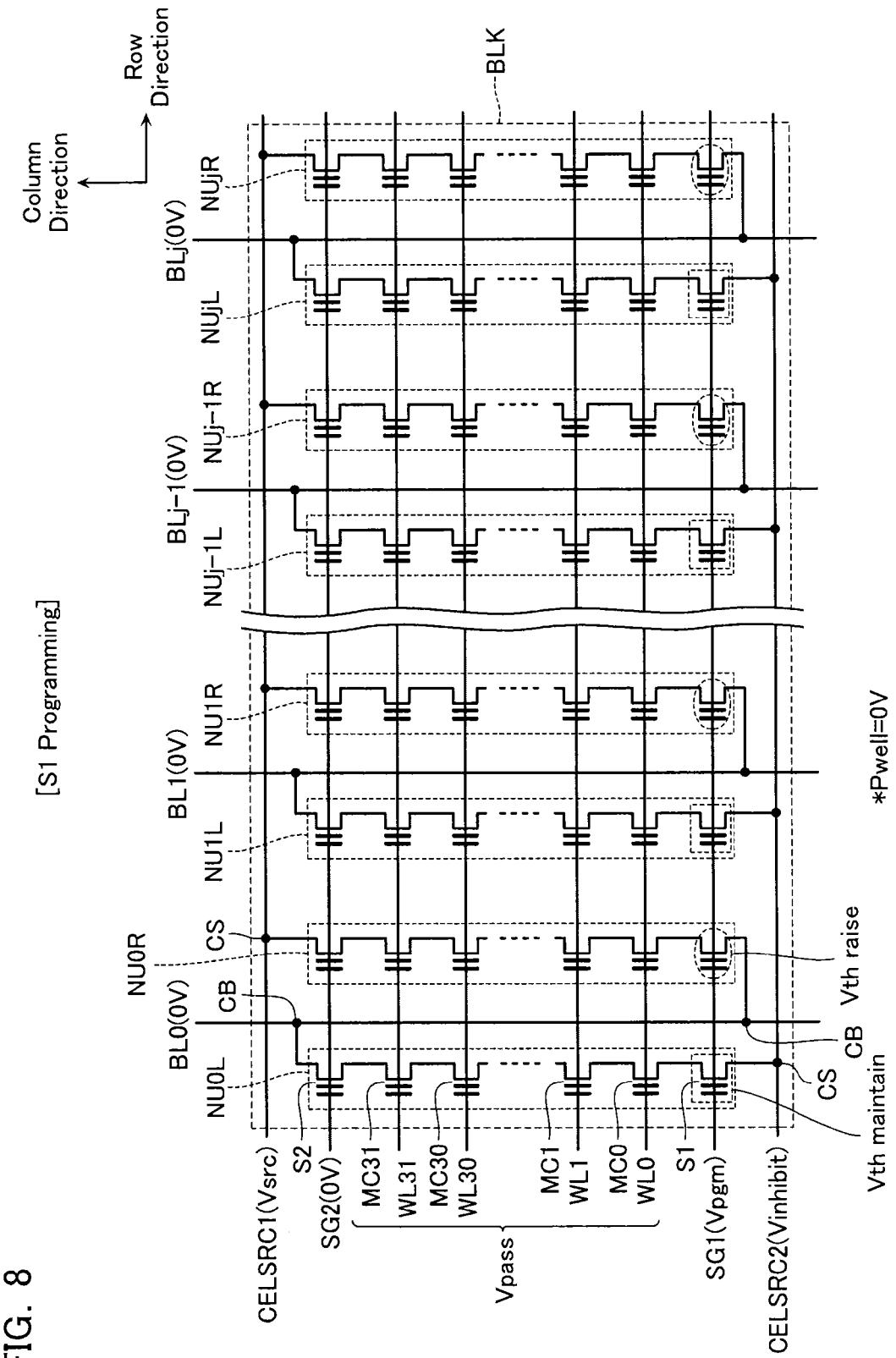
FIG. 8 is a schematic view explaining a write operation (threshold voltage change operation) and a write verify operation on select transistors S1 and S2 in the first embodiment.
Figure 9:
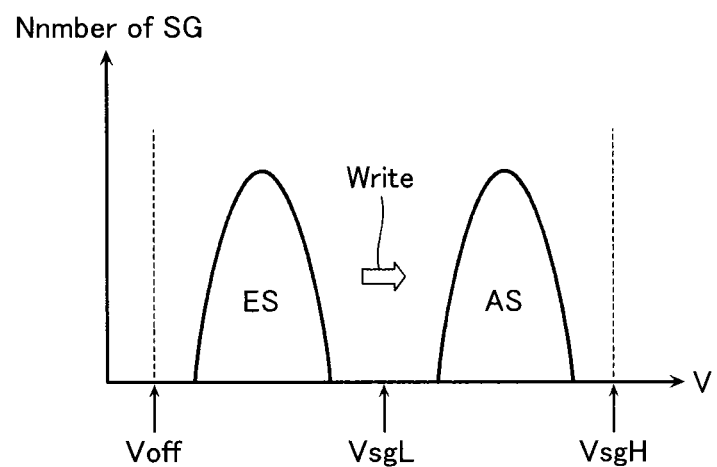
FIG. 9 is a schematic view explaining a threshold voltage distribution of the select transistors S1 and S2 in the first embodiment.
Figure 10:
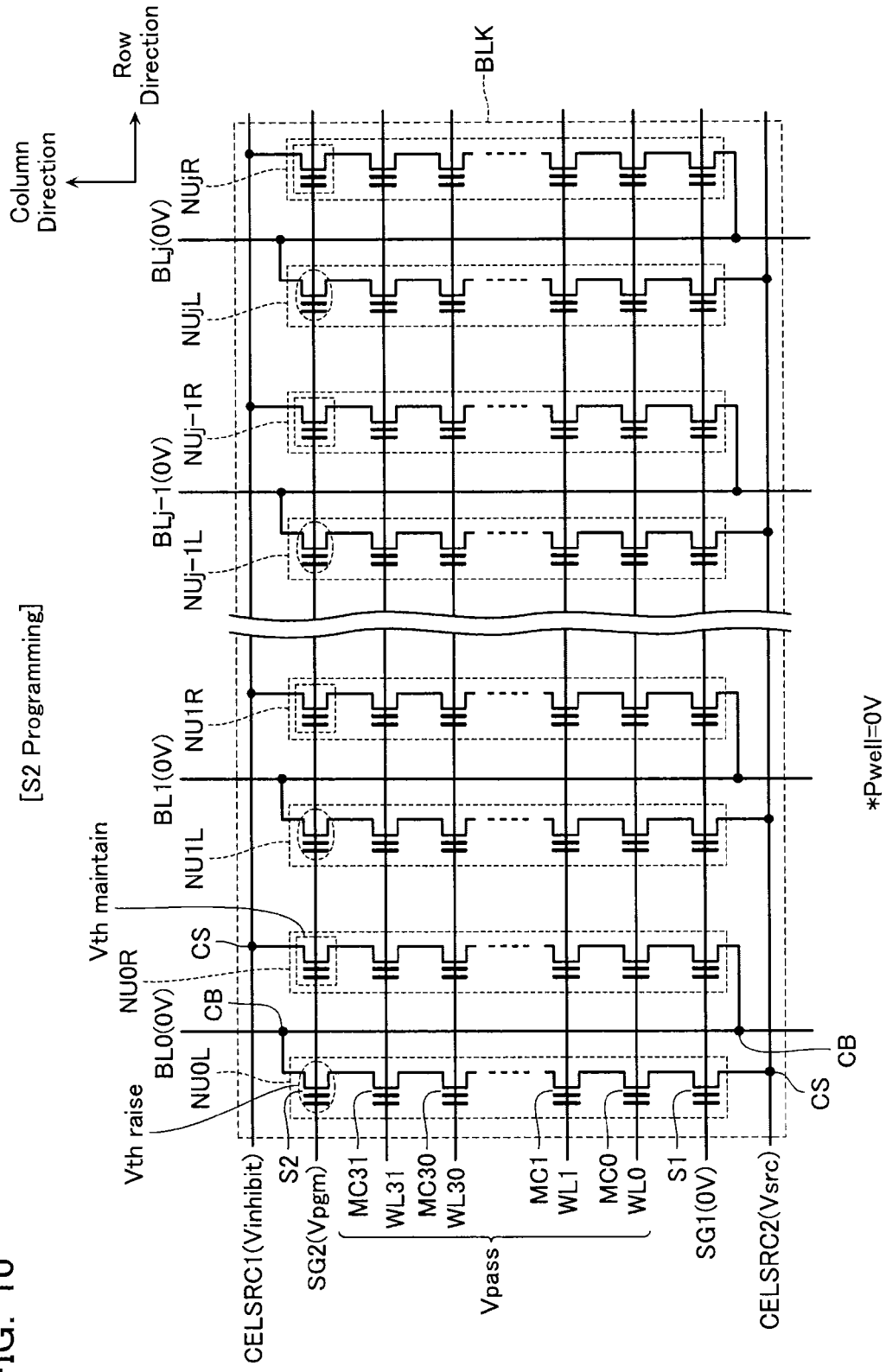
FIG. 10 is a schematic view explaining the write operation (threshold voltage change operation) and the write verify operation on the select transistors S1 and S2 in the first embodiment.

Next, a write operation (threshold voltage change operation) on the select transistors S1 and S2 and a write verify operation of that write operation are described with reference to FIGS. 8 to 11. FIGS. 8 to 10 show applied voltages when performing each operation, along with a circuit diagram, and FIG. 11 is a timing chart showing a change in a voltage.

First, the write operation on the select transistor S1 will be described with reference to FIGS. 8 and 11. FIG. 8 describes the write operation for raising the threshold voltage of the select transistor S1 (that is, the select transistor S1 functioning as the bit-line-side select transistor SGD) in the NAND cell unit NUiR. On the other hand, the threshold voltage of the select transistor S1 in the NAND cell unit NUiL is left as it is, without being changed. Setting the threshold voltage of the select transistor S1 in the NAND cell unit NUiR to a different voltage value to that of the threshold voltage of the select transistor S1 in the NAND cell unit NUiL in this way makes it possible to select either one of the two NAND cell units NUiR and NUiL connected to one bit line BLi.

Figure 11:
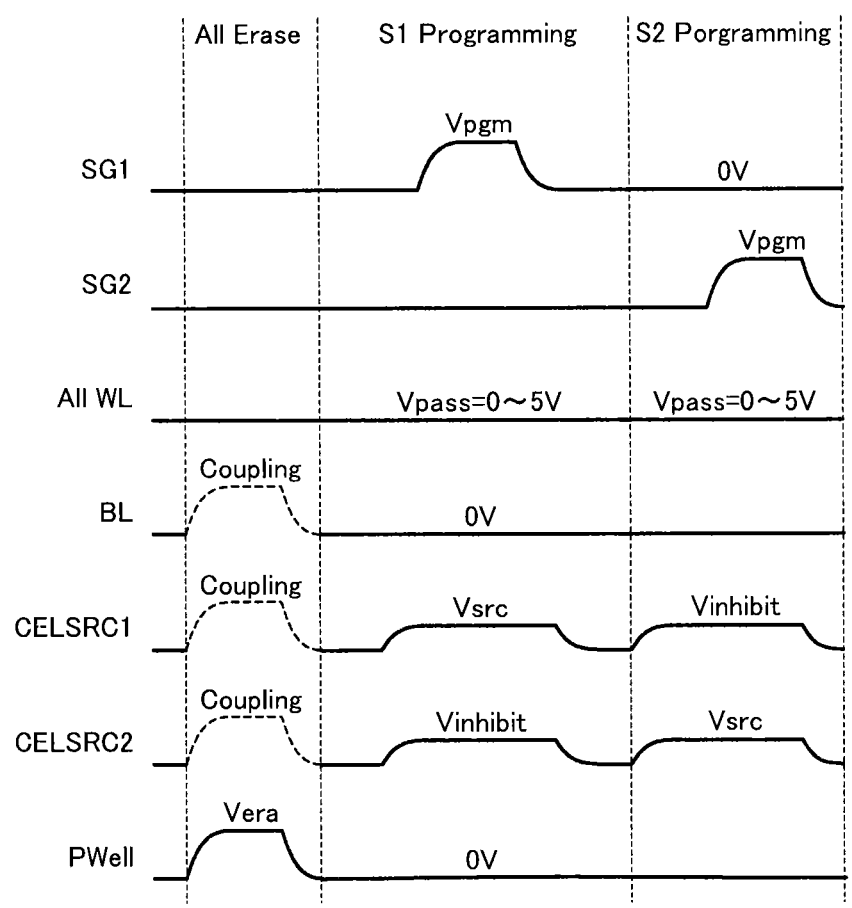
FIG. 11 is a timing chart explaining the write operation (threshold voltage change operation) on the select transistors S1 and S2 in the first embodiment.

As shown in FIG. 11, when performing the write operation on the select transistor S1, first, before execution of that write operation, an erase operation is performed on the block BLK. That is, a voltage of a p type well where the block BLK is formed is set to an erase voltage Vera (about 15 to 20 V), while a voltage of the word lines WL0 to WL31 is set to 0 V. Moreover, the select gate lines S1 and S2 are set to 0 V. As a result, the threshold voltage of the memory cells MC and the select transistors S1 and S2 is lowered to an erase state threshold voltage distribution. At this time, as shown in FIG. 9, the select transistors S1 and S2 attain an erase state threshold voltage distribution ES.

Then, as shown in FIG. 8, after a voltage of all the bit lines BL has been set to 0 V, voltages of the source lines CELSRC1 and CELSRC2 are set to voltages Vsrc and Vinhibit, respectively. The voltage Vsrc is a voltage of about 1V, and the voltage Vinhibit is a voltage larger than this of about 3 V.

The voltage of the word lines WL is set to a voltage Vpass. The voltage Vpass need only be a voltage enabling the memory cells MC in an erase state to be conductive, and can be set to, for example, 0 V (refer to FIG. 11).

Then, a voltage of the select gate line SG1 is raised from 0 V to a voltage Vpgm (15 to 20 V). As a result, electrons are injected into the floating gate FG of the select transistor S1 in the NAND cell unit NUiR due to a potential difference between the voltage Vpgm and the voltage of the bit line BL (0 V), whereby the threshold voltage of the select transistor S1 rises. This write operation is executed repeatedly until the threshold voltage distribution of the select transistor S1 changes from the erase state threshold voltage distribution ES to a write state threshold voltage distribution AS (refer to FIG. 9). On the other hand, in the select transistor S1 in the NAND cell unit NUiL, the voltage Vinhibit is high at about 3 V, hence the threshold voltage of this select transistor S1 in the NAND cell unit NUiL hardly changes. Note that since the select gate line SG2 is maintained unchanged at 0 V, the threshold voltage of the select transistor S2 does not change at this stage.

Note that the write state threshold voltage of the select gate SG does not need to be set as high as that of the memory cell, hence the write voltage Vpgm is preferably set to a value which is lower than that of the memory cell write voltage Vpgm.

Next, although not illustrated in the drawings, the write verify operation for judging whether the write operation on this select transistor S1 has been completed or not is implemented in a similar manner to a write operation on an ordinary memory cell. The above-described write operation is repeated until write completion is judged by this write verify operation.

Next, the write operation on the select transistor S2 will be described with reference to FIGS. 10 and 11. In FIG. 10, the write operation for raising the threshold voltage of the select transistor S2 (that is, the select transistor S2 functioning as the bit side select transistor SGD) in the NAND cell unit NUiL is performed. On the other hand, the threshold voltage of the select transistor S2 in the NAND cell unit NUiR is left as it is, without being changed. Setting the threshold voltage of the select transistor S2 in the NAND cell unit NUiL to a different voltage value to that of the threshold voltage of the select transistor S2 in the NAND cell unit NUiR in this way makes it possible to select either one of the two NAND cell units NUiR and NUiL connected to one bit line BLi.

The write operation on the select transistor S2 is performed as follows. As shown in FIG. 10, after a voltage of all the bit lines BL has been set to 0 V, voltages of the source lines CELSRC1 and CELSRC2 are set to the voltages Vinhibit and Vsrc, respectively, conversely to the case of FIG. 8. A voltage of the word lines WL is set to the voltage Vpass (for example, 0 V). A voltage of the select gate lines SG1 and SG2 is set to 0 V.

Then, a voltage of the select gate line SG2 is raised from 0 V to the voltage Vpgm (15 to 20 V). As a result, electrons are injected into the floating gate FG of the select transistor S2 in the NAND cell unit NUiL due to a potential difference between the voltage Vpgm and the voltage of the bit line BL (0 V), whereby the threshold voltage of the select transistor S2 rises. This write operation is executed repeatedly until the threshold voltage distribution of the select transistor S2 changes from the erase state threshold voltage distribution ES to the write state threshold voltage distribution AS. On the other hand, in the select transistor S2 in the NAND cell unit NUiR, the voltage Vinhibit is high at about 3 V, hence the threshold voltage of this select transistor S2 in the NAND cell unit NUiR hardly changes.

Note that since the select gate line SG1 is maintained unchanged at 0 V, the threshold voltage of the select transistor S1 does not change at this stage (the threshold voltage provided in the operation of FIG. 8 is maintained unchanged).

Next, although not illustrated in the drawings, the write verify operation for judging whether the write operation on this select transistor S2 has been completed or not is implemented in a similar manner to a write operation on an ordinary memory cell. The above-described write operation is repeated until write completion is judged by this write verify operation.

Thus, as a result of operations described using FIGS. 8 to 11, the write operation (threshold voltage change operation)

on the select transistors S1 and S2 and the write verify operation of that write operation are completed. As a result of the above-described operations, while the select transistor S1 in the NAND cell unit NUiR and the select transistor S2 in the NAND cell unit NUiL are provided with a high threshold voltage (threshold voltage distribution AS), the select transistor S1 in the NAND cell unit NUiL and the select transistor S2 in the NAND cell unit NUiR are provided with a lower threshold voltage (threshold voltage distribution ES). The above makes it possible to select either one of the two NAND cell units NUiL and NUiR connected to one bit line BL, and thereby execute a write operation or a read operation.

(Read Operation)

Figure 12:
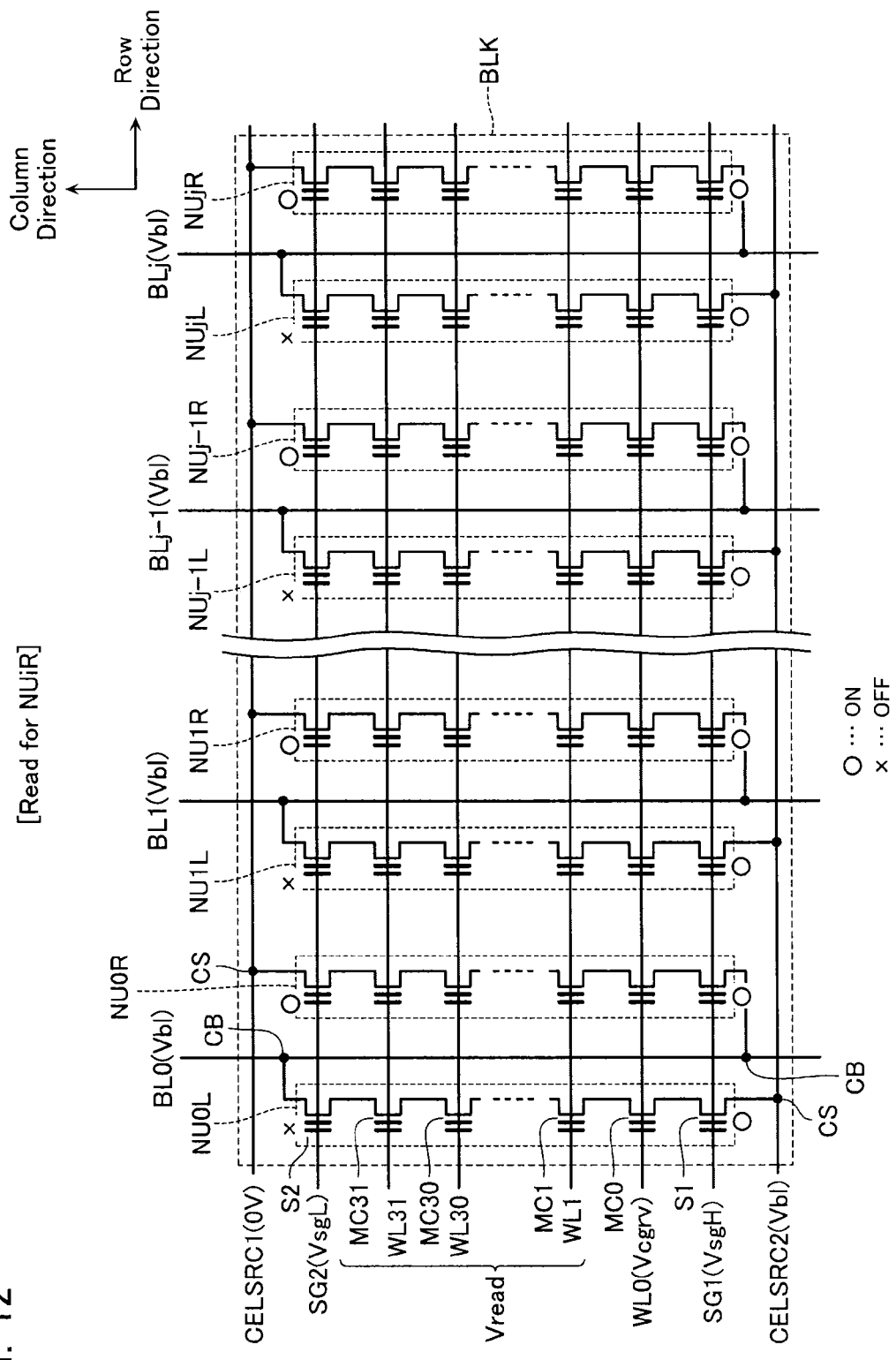
FIG. 12 is a schematic view explaining a read operation of a memory cell MC in the first embodiment.
Figure 13:
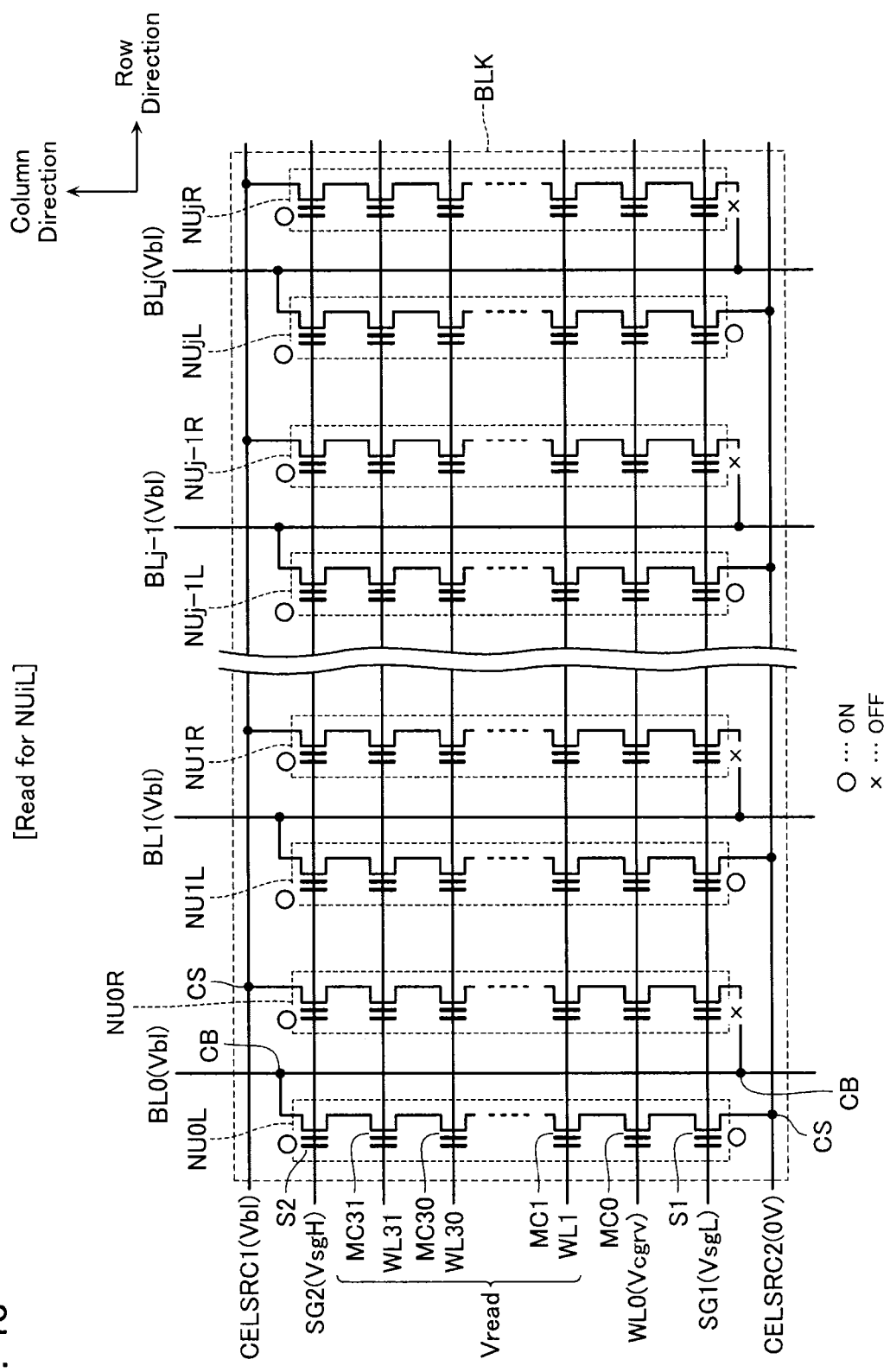
FIG. 13 is a schematic view explaining the read operation of the memory cell MC in the first embodiment.
Figure 14:
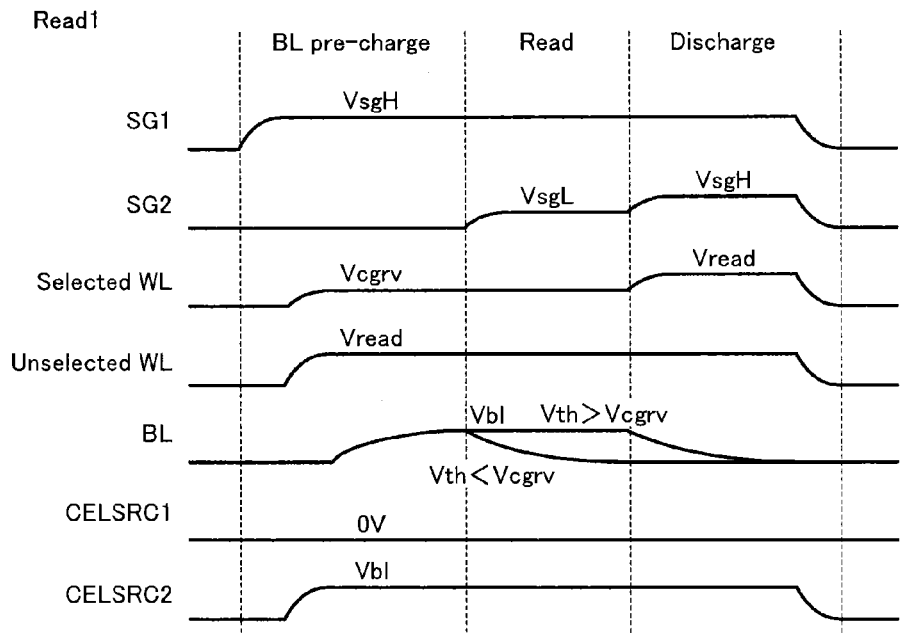
FIG. 14 is a timing chart explaining the read operation of the memory cell MC in the first embodiment.
Figure 15:
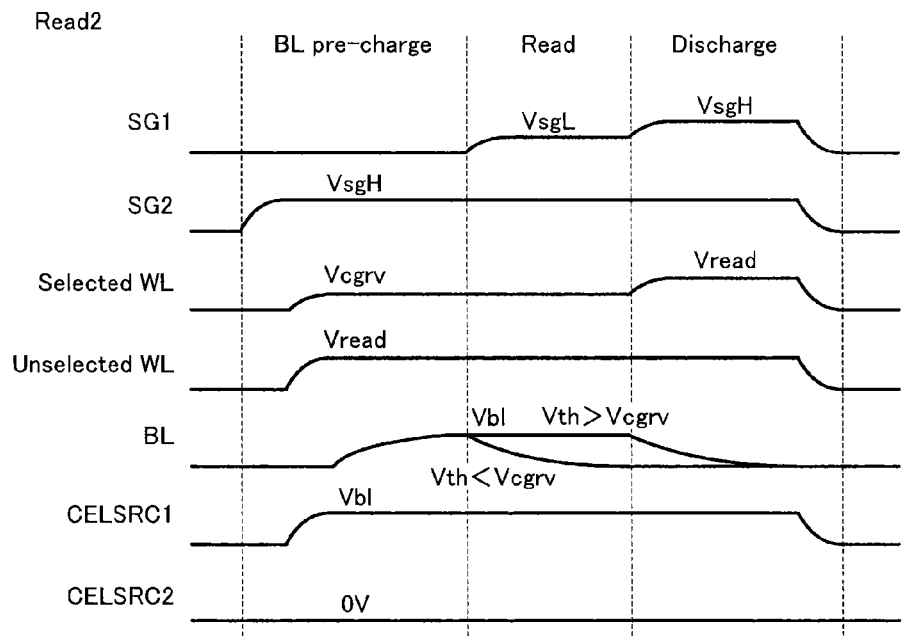
FIG. 15 is a timing chart explaining the read operation of the memory cell MC in the first embodiment.

Next, a specific procedure when executing a read operation of the memory cell MC after the write operation of the select transistors S1 and S2 described in FIGS. 8 to 11 has finished will be described with reference to FIGS. 12 to 15. FIGS. 12 and 13 show applied voltages when performing the read operation, along with a circuit diagram, and FIGS. 14 and 15 are timing charts showing a change in voltage.

It is assumed here that the memory cell MC has undergone execution of a write operation described later and has been provided with an erase state threshold voltage distribution E or a write state threshold voltage distribution A. Moreover, description proceeds assuming that the memory cell MC0 connected to the word line WL0 is a target of the read operation.

The read operation of this embodiment is executed divided into a first read operation (FIG. 12) having the NAND cell unit NUiR as a read target and a second read operation (FIG. 13) having the NAND cell unit NUiL as a read target.

First, the first read operation will be described with reference to FIGS. 12 and 14. As shown in FIG. 14, the first read operation is broadly divided into a bit line pre-charge operation, a read operation, and a discharge operation.

In the bit line pre-charge operation, the select gate line SG1 is applied with a voltage VsgH, while the select gate line SG2 has its voltage maintained at 0 V (refer to FIG. 14). Moreover, the selected word line WL0 is applied with a read voltage Vcgry intermediate between the threshold voltage distributions E and A, and the unselected word lines WL1 to WL31 are applied with a read pass voltage Vread. The read pass voltage Vread is a voltage capable of rendering the memory cell MC conductive whatever threshold voltage the memory cell MC has, and is set to a value of, for example, about 6 to 8 V.

In addition, all the bit lines BL are charged to a voltage Vb1. Meanwhile, the source line CELSRC1 is maintained unchanged at 0 V, and the source line CELSRC2 is charged to the voltage Vb1.

Having such voltages applied causes both the select transistor S1 in the NAND cell unit NUiL and the select transistor S1 in the NAND cell unit NUiR to be set to a conduction-capable state.

In the read operation following completion of the pre-charge operation, the voltage of the select gate line SG2 is raised from 0 V to a voltage VsgL. As a result, the select transistor S2 in the NAND cell unit NUiR is set to a conduction-capable state, whereby the read operation of the NAND cell unit NUiR is started. On the other hand, the select transistor S2 in the NAND cell unit NUiL does not attain a conductive state, because the select transistor S2 in the NAND cell unit NUiL is written to the threshold voltage distribution AS. Therefore, the NAND cell unit NUiL is not made a read target.

If the threshold voltage of the read target memory cell MC0 in the NAND cell unit NUiR is not less than the read voltage Vcgrv, the memory cell MC0 is not conductive, hence the voltage of the bit line BL is maintained unchanged at Vb1. On the other hand, if the threshold voltage of the memory cell MC0 is smaller than the read voltage Vcgrv, the memory cell MC0 is conductive, hence the bit line BL is discharged from Vb1 toward 0 V. Detecting this change in voltage of the bit line BL by the sense amplifier circuit 2 allows data held by the memory cell MC to be judged.

When the read operation has finished, the voltage of the selected word line WL is raised from Vcgry to the voltage Vread, and the voltage of the select gate line SG2 is raised from the voltage VsgL to the voltage VsgH, thereby discharging the voltage of the bit line BL (discharge operation). As a result of the above, the read operation on the NAND cell unit NUiR finishes.

Next, the second read operation will be described with reference to FIGS. 13 and 15.

The second read operation differs from the first read operation in the points below. However, the second read operation is basically a similar operation to the first read operation, hence a detailed description of the second read operation is omitted.

The applied voltages of the select gates SG1 and SG2 are the reverse of those in the first read operation.

The applied voltages of the source lines CELSRC1 and CELSRC2 are the reverse of those in the first read operation.

(Write Operation)

Figure 16:
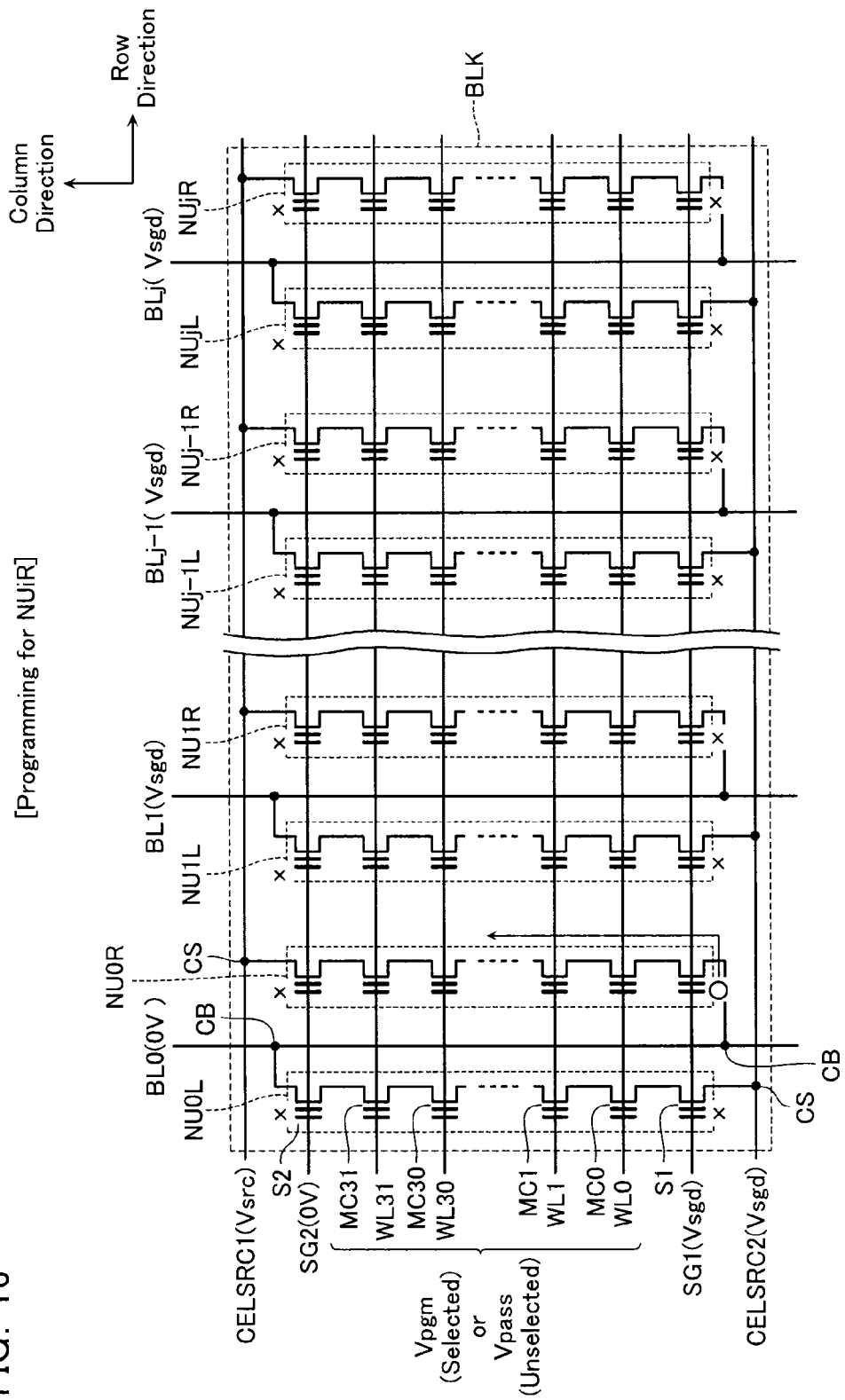
FIG. 16 is a schematic view explaining a write operation of a memory cell MC in the first embodiment.
Figure 17:
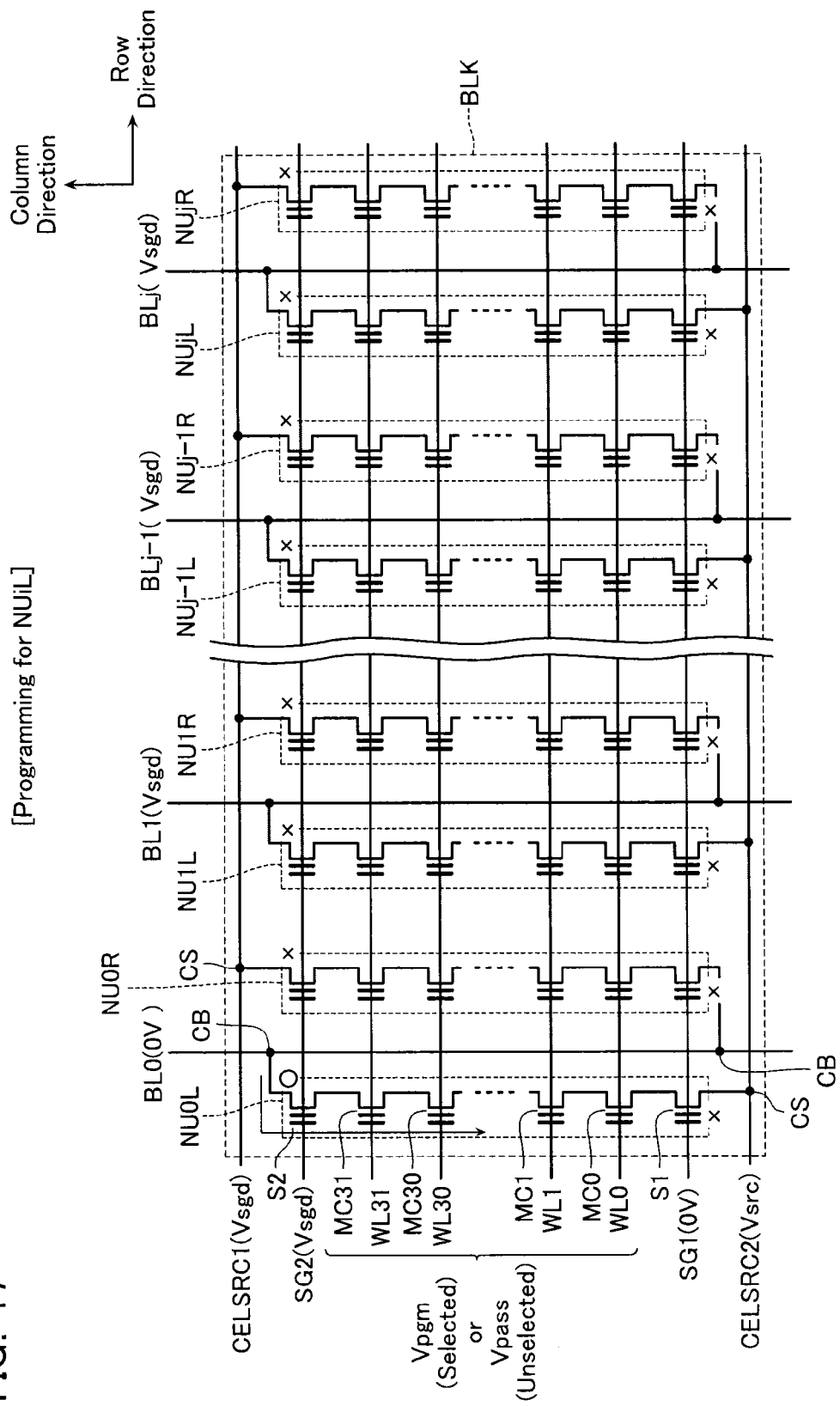
FIG. 17 is a schematic view explaining the write operation of the memory cell MC in the first embodiment.
Figure 18:
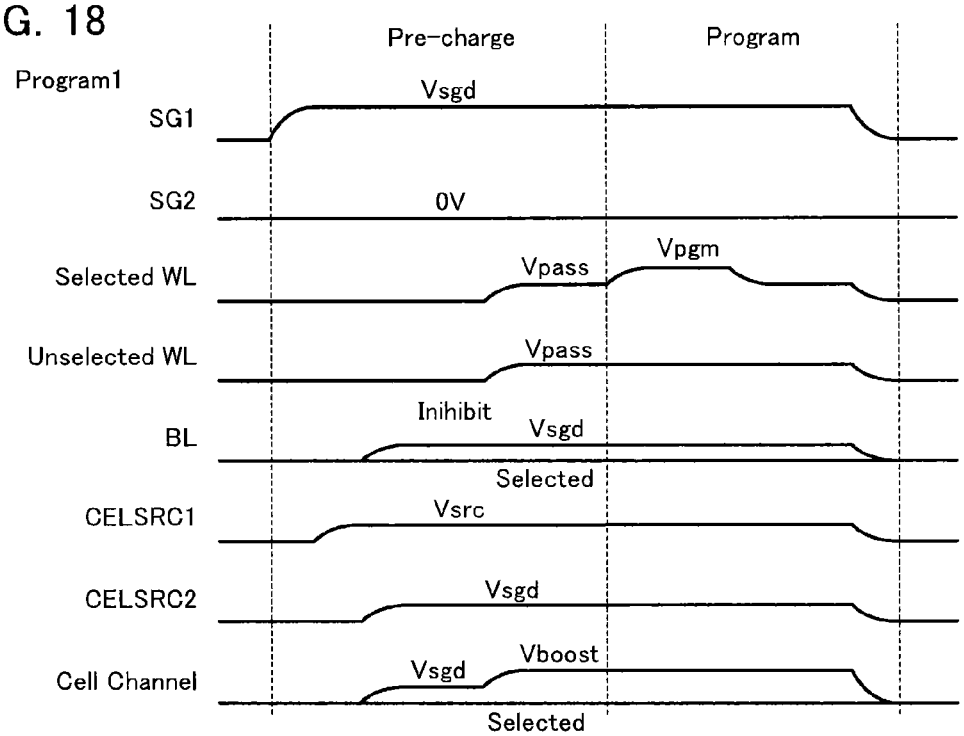
FIG. 18 is a timing chart explaining the write operation of the memory cell MC in the first embodiment.
Figure 19:
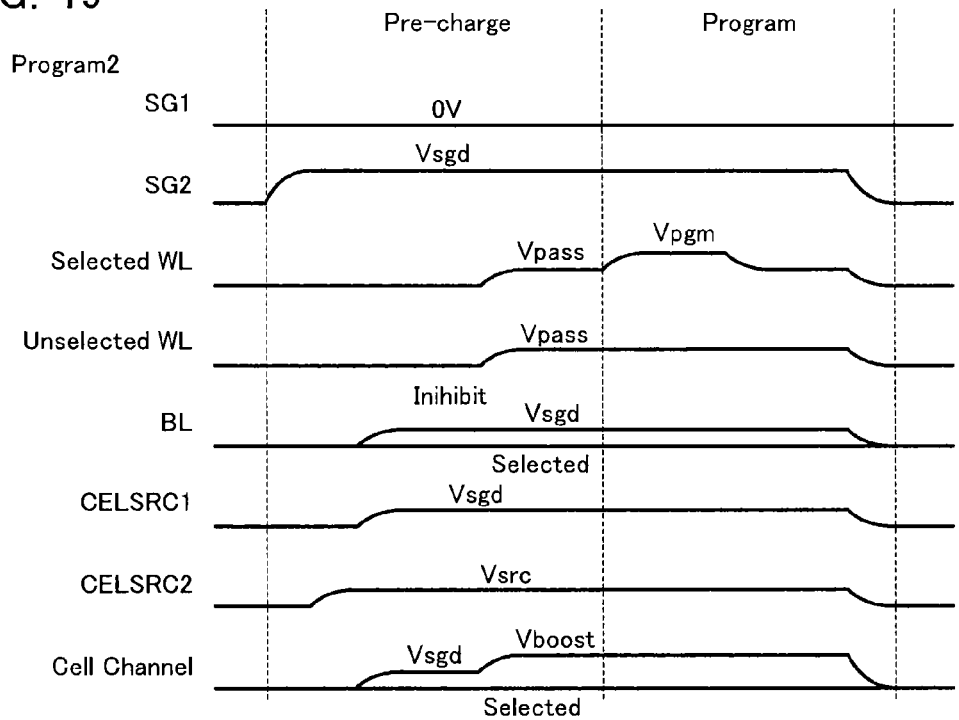
FIG. 19 is a timing chart explaining the write operation of the memory cell MC in the first embodiment.

Next, a specific procedure when executing a write operation of the memory cell MC after the write operation of the select transistors S1 and S2 described in FIGS. 8 to 11 has finished will be described with reference to FIGS. 16 to 19. FIGS. 16 and 17 show applied voltages when performing the write operation to the memory cell MC, along with a circuit diagram, and FIGS. 18 and 19 are timing charts showing a change in voltage.

The write operation of this embodiment is executed divided into a first write operation (FIG. 16) having the NAND cell unit NUiR as a target and a second write operation (FIG. 17) having the NAND cell unit NUiL as a target.

First, the first write operation will be described with reference to FIGS. 16 and 18. As shown in FIG. 18, the write operation of FIG. 16 is broadly divided into a pre-charge operation and a write (program) operation.

In the pre-charge operation, initially, the select gate line SG1 is charged to a voltage Vsgd (about 4 V). On the other hand, a voltage of the select gate line SG2 is maintained unchanged at 0 V.

In addition, a voltage of the source line CELSRC1 is charged to a voltage Vsrc (about 1 V), while a voltage of the source line CELSRC2 is charged to the voltage Vsgd.

The bit line BL is provided with either of 0 V or the voltage Vsgd, depending on a kind of data ("0" or "1" ("1" is write prohibit)) to be written to the selected memory cell. Moreover, the word lines WL are all applied with a voltage Vpass at a stage of the pre-charge operation. Note that FIG. 16 illustrates the case where the bit line BL0 is set to 0 V and the other bit lines are set to Vsgd. Therefore, write to data "0" is executed only in the NAND cell unit NU0R, and write in the other NAND cell units is prohibited.

As a result of the voltage applications in the pre-charge operation as above, the select transistors S2 are all set to a non-conductive state. Regarding the select transistor S1 in the NAND cell unit NUiR, if the voltage provided to the bit line BLi is 0 V, the select transistor S1 in the NAND cell unit NUiR is maintained in a conductive state, and if the voltage provided to the bit line BLi is the voltage Vsgd, the select transistor S1 in the NAND cell unit NUiR switches to a non-conductive state after a channel is boosted to the voltage Vsgd (Subsequently, the channel portion rises further to a voltage Vboost due to coupling as a result of the word line WL being boosted to the voltage Vpass). The select transistor S1 in the NAND cell unit NUiL is maintained in a non-conductive state, because the voltage of the source line CELSRC2 is Vsgd.

In the write operation that follows, a potential of the selected word line WL connected to the selected memory cell switches from the voltage Vpass to a voltage Vpgm (about 20 to 25 V). As a result, the threshold voltage in the selected memory cell rises, whereby the write operation is performed.

Next, the second write operation will be described with reference to FIGS. 17 and 19.

The second write operation differs from the first write operation in the points below. However, the second write operation is basically a similar operation to the first write operation except for the following points, hence a detailed description of the second write operation is omitted.

The applied voltages of the select gates SG1 and SG2 are the reverse of those in the first write operation.

The applied voltages of the source lines CELSRC1 and CELSRC2 are the reverse of those in the first write operation.

(Erase Operation and Erase Verify Operation)

Next, a specific procedure when executing an erase operation of the memory cell MC and an erase verify operation will be described with reference to FIGS. 20 to 24.

Figure 20:
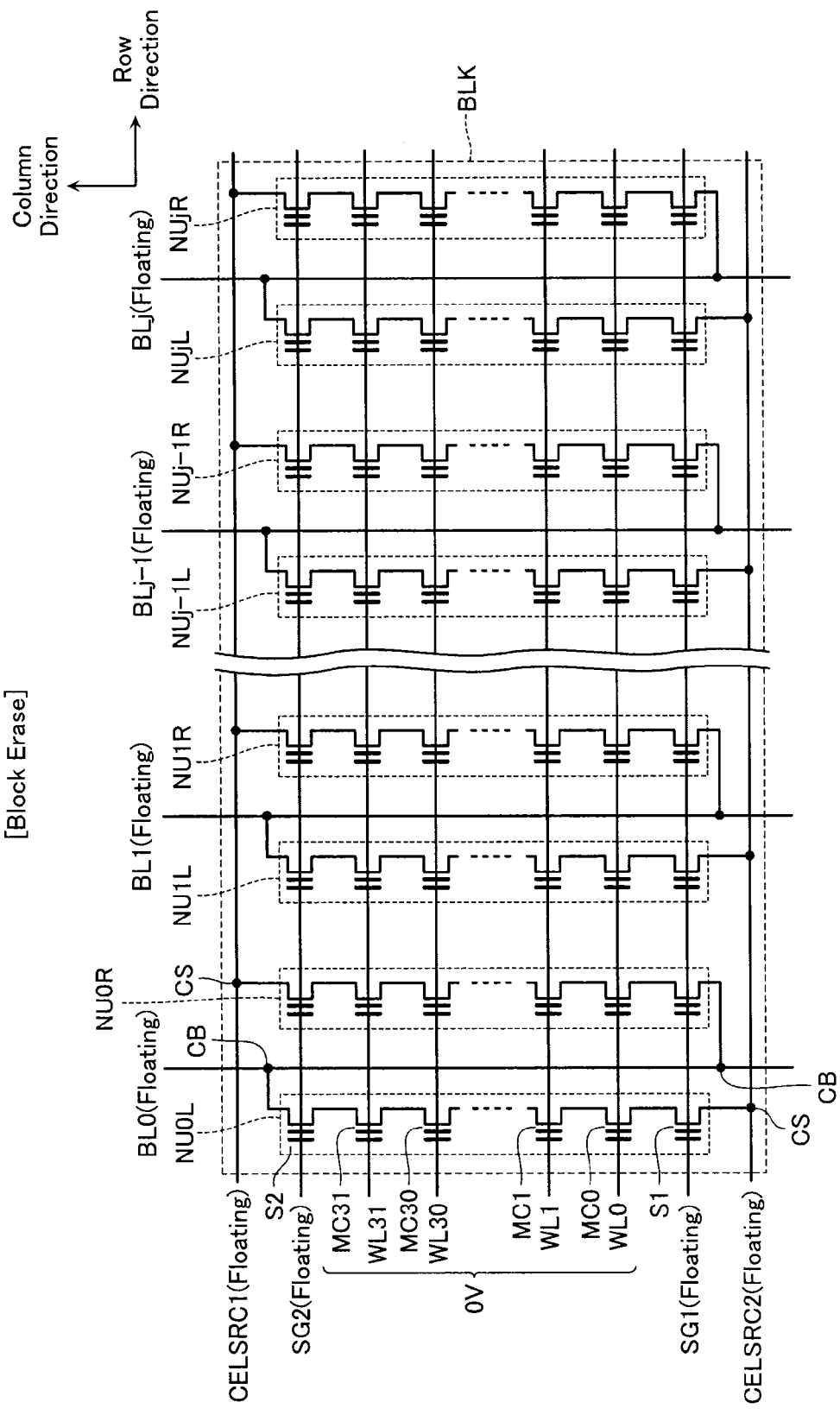
FIG. 20 is a schematic view explaining an erase operation of a memory cell MC in the first embodiment.
Figure 21:
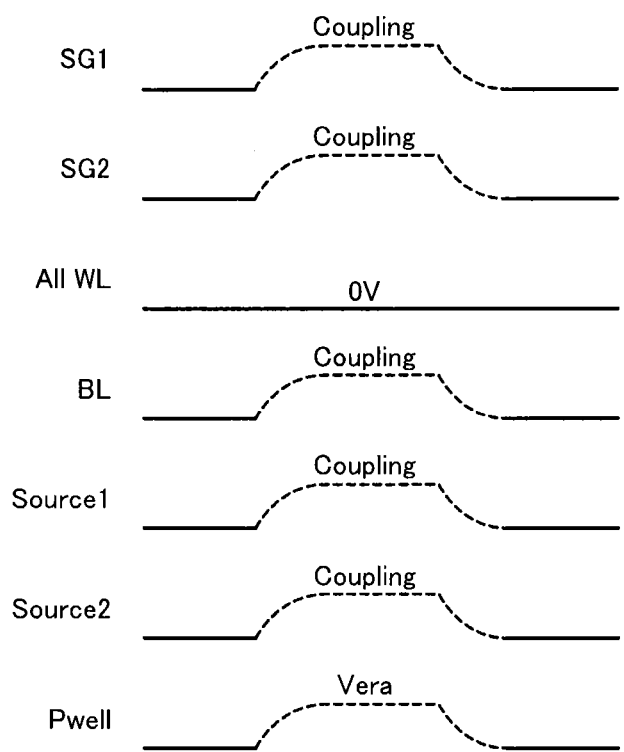
FIG. 21 is a schematic view explaining the erase operation of the memory cell MC in the first embodiment.

FIGS. 20 and 21 show applied voltages when performing the erase operation to the memory cell MC. The erase operation is performed by a similar method to that in a nonvolatile semiconductor memory device of conventional technology. Specifically, the select gate lines SG1 and SG2, the bit lines BL, and the source lines CELSRC1 and CELSRC2 are all maintained in a floating state. Meanwhile, the p type well is applied with an erase voltage Vera. As a result, voltages of the select gate lines SG1 and SG2, the bit lines BL, and the source lines CELSRC1 and CELSRC2 rise due to coupling. Applying 0 V to the word line WL under these conditions results in the erase operation being performed.

Next, the erase verify operation will be described with reference to FIGS. 22 to 24.

Figure 22:
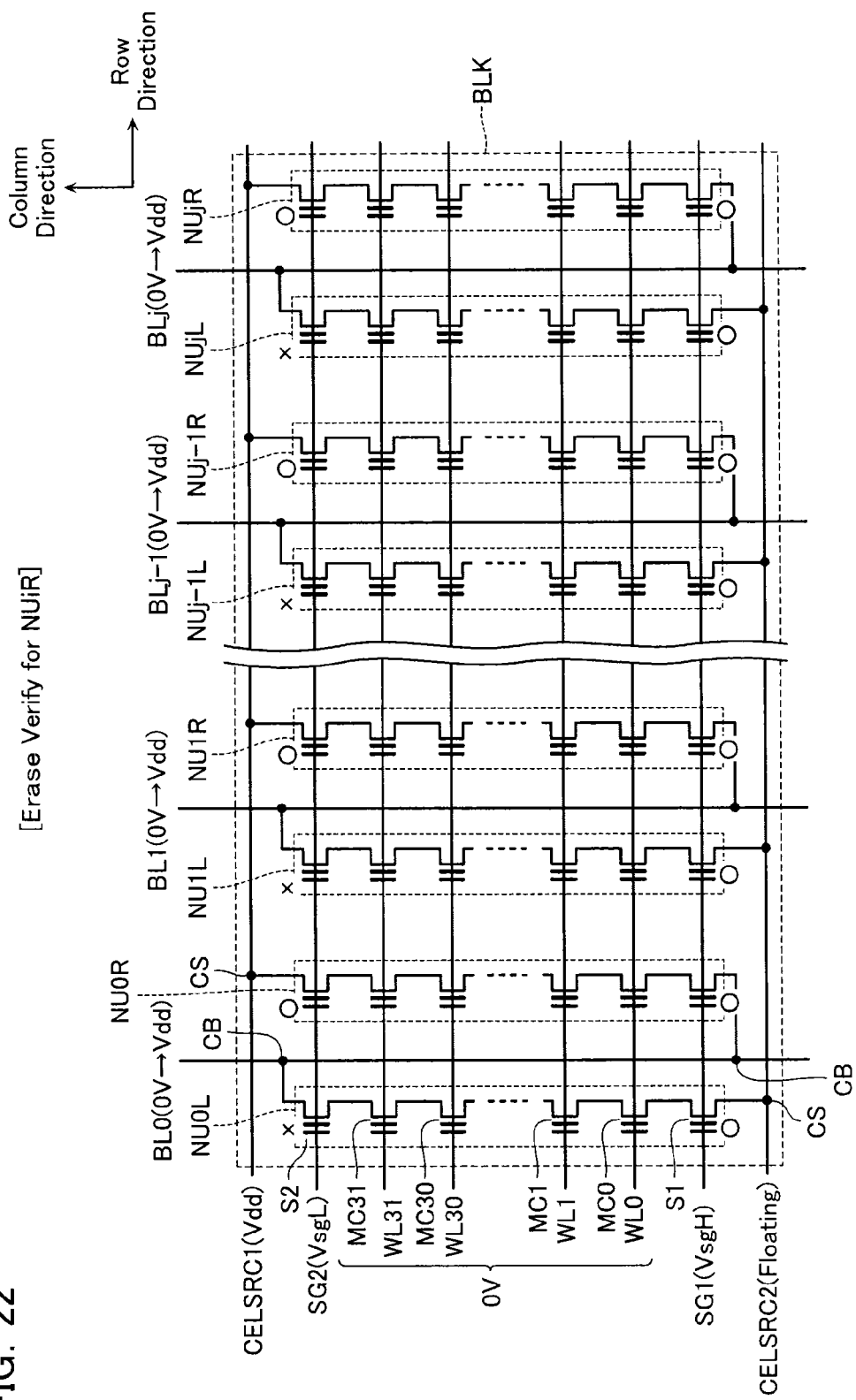
FIG. 22 is a schematic view explaining an erase verify operation of a memory cell MC in the first embodiment.
Figure 23:
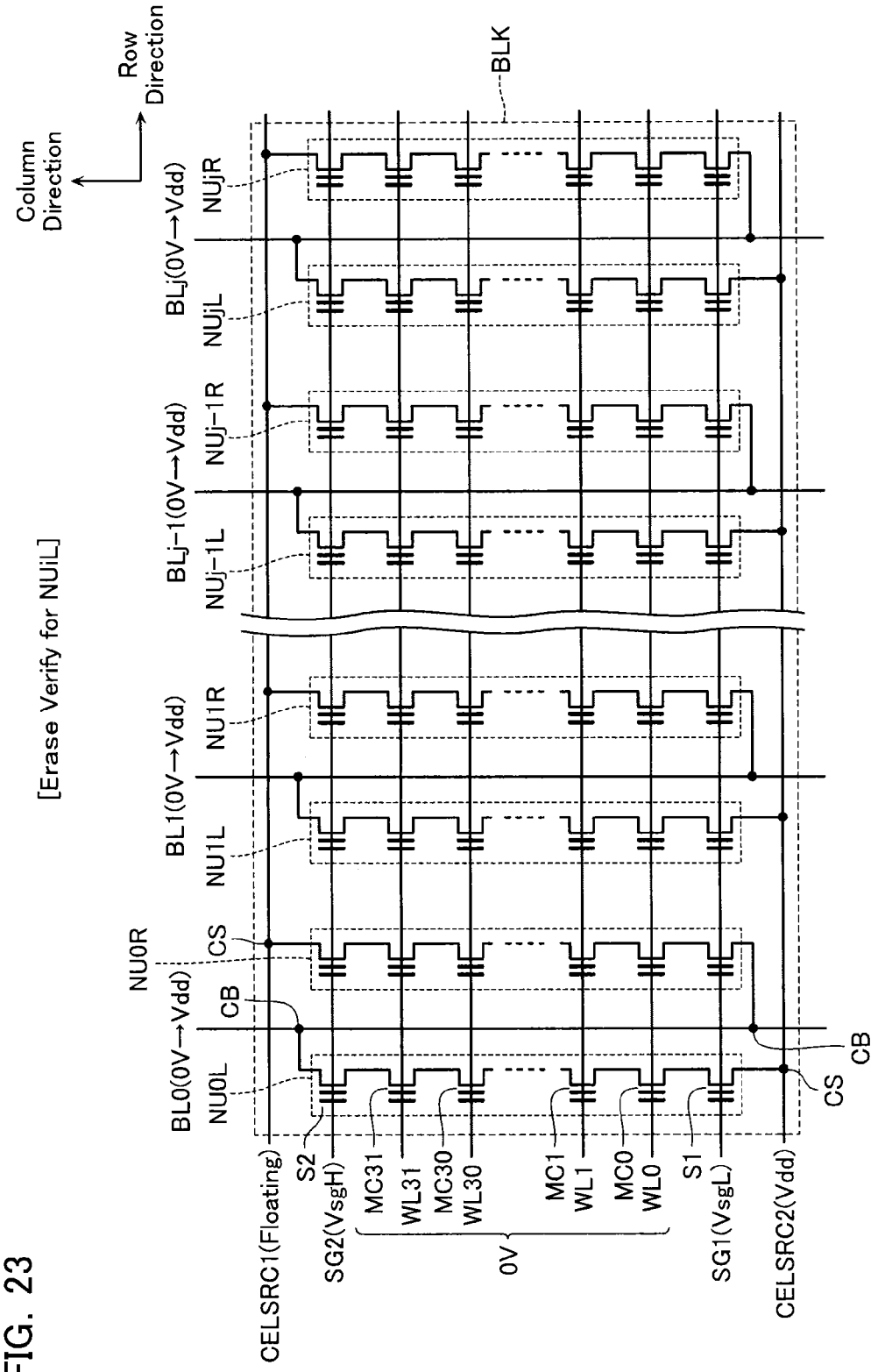
FIG. 23 is a schematic view explaining the erase verify operation of the memory cell MC in the first embodiment.
Figure 24:
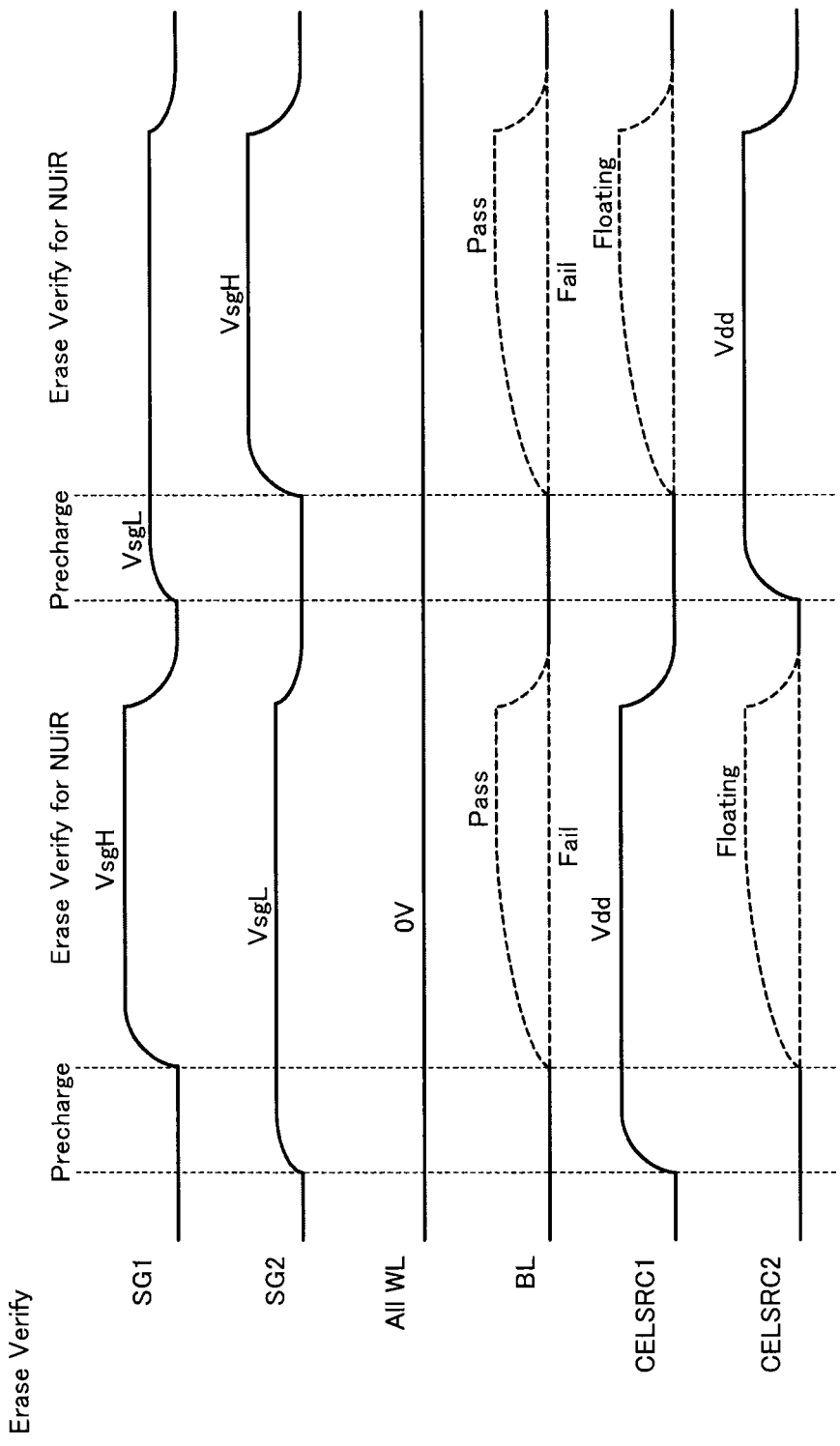
FIG. 24 is a timing chart explaining the erase verify operation of the memory cell MC in the first embodiment.

FIGS. 22 and 23 show applied voltages when performing the erase verify operation, along with a circuit diagram, and FIG. 24 is a timing chart showing a change in voltage.

The erase verify operation of this embodiment is executed divided into a first erase verify operation (FIG. 22) having the NAND cell unit NUiR as a target and a second erase verify operation (FIG. 23) having the NAND cell unit NUiL as a target.

First, the first erase verify operation will be described with reference to FIGS. 22 and 24. As shown in FIG. 24, the first erase verify operation is broadly divided into a pre-charge operation and an erase verify read operation.

In the pre-charge operation, the select gate line SG1 is provided with 0 V, while the select gate line SG2 is provided with a voltage VsgL. The select transistor S2 in the NAND cell unit NUiL provided with the threshold voltage distribution AS is set to a non-conductive state, while the select transistor S2 in the NAND cell unit NUiR provided with the threshold voltage distribution ES is set to a conductive state.

In addition, all the word lines WL are provided with 0 V and the bit line BL is provided with 0 V. The source line CELSRC1 is provided with a power supply voltage Vdd and the source line CELSRC2 is maintained in a floating state.

After the pre-charge operation has finished, the source line CELSRC2 is switched to a floating state and the voltage of the select gate line SG1 is raised to a voltage VsgH. As a result, the erase verify read operation is started. The select transistor S2 in the NAND cell unit NUiR switches to a conductive state, whereby a current flowing in the NAND cell unit changes and the voltage of the bit line BL changes, according to a degree of progress of the erase operation of the memory cells MC0 to MC31. In the case that the erase operation is completed, a current flows in the NAND cell unit, whereby the voltage of the bit line BL rises from 0 V to an absolute value of the threshold voltage of a memory cell having the highest threshold voltage. In the case that the erase operation is not completed, the memory cell is not conductive, hence the voltage of the bit line BL is maintained unchanged at 0 V. This change in voltage of the bit line BL is detected by the sense amplifier circuit 2, whereby erase verify judgment is performed.

Next, the second erase verify operation will be described with reference to FIGS. 23 and 24.

The second erase verify operation differs from the first erase verify operation in the points below. However, the second erase verify operation is basically a similar operation to the first erase verify operation, hence a detailed description of the second erase verify operation is omitted.

The applied voltages of the select gates SG1 and SG2 are the reverse of those in the first erase verify operation.

The applied voltages of the source lines CELSRC1 and CELSRC2 are the reverse of those in the first erase verify operation.

[Advantages]

As a result of this first embodiment, it is sufficient to provide one select transistor at one end of one NAND cell unit, even when adopting the shared bit line system. This therefore makes it possible to achieve miniaturization of the memory cell array and reduce cell array area, while achieving an improvement in bit density of the memory cell array.

[Second Embodiment]

Next, a nonvolatile semiconductor memory device according to a second embodiment will be described with reference to FIGS. 25 to 32. The nonvolatile semiconductor memory device of this embodiment has an overall configuration which is similar to that of the first embodiment, excluding a circuit configuration in the memory cell array 1.

Figure 25:
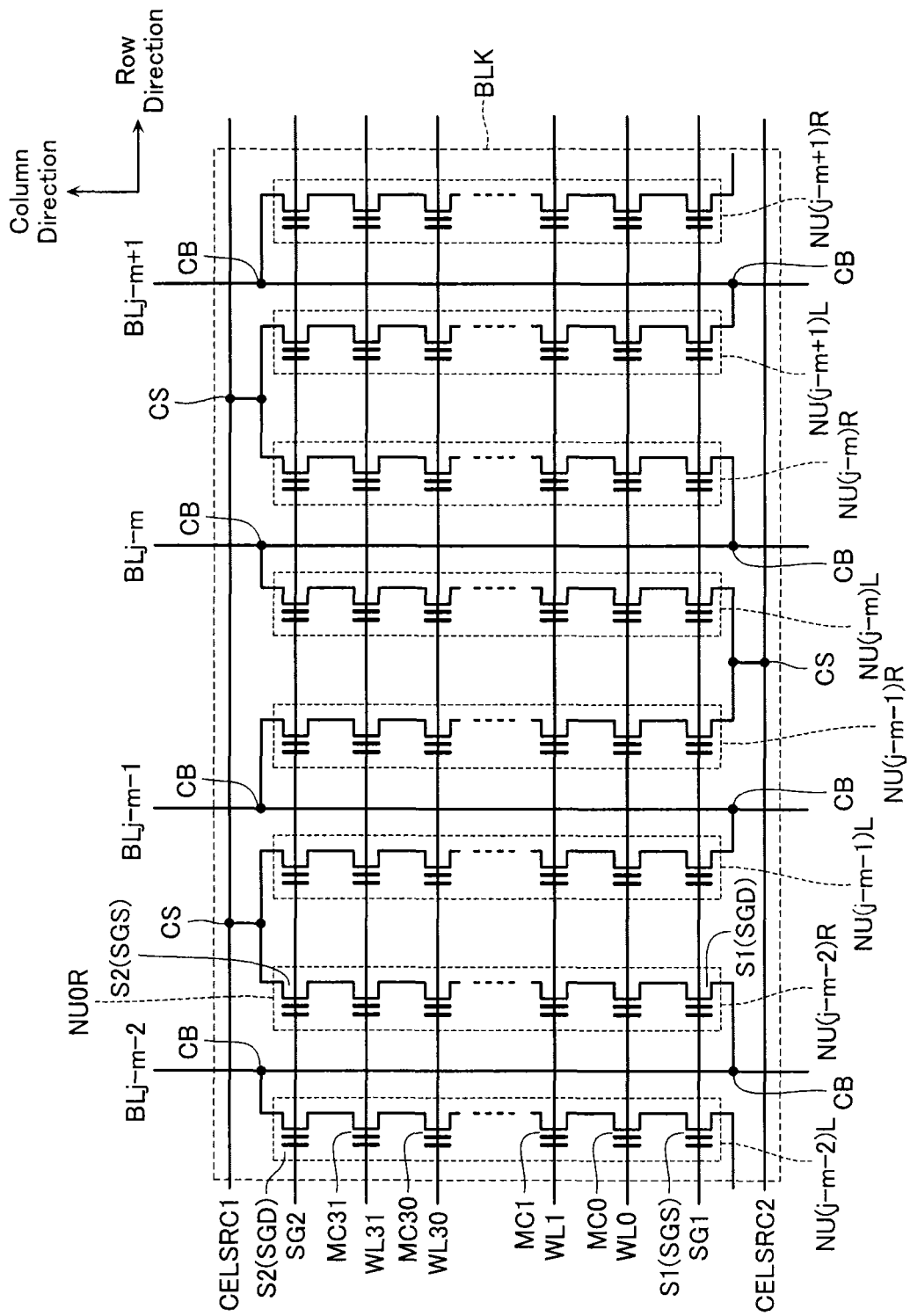
FIG. 25 is a circuit diagram of one block BLK in a memory cell array 1 of a nonvolatile semiconductor memory device according to a second embodiment.

Below, a circuit diagram of one block BLK in the memory cell array 1 of the second embodiment will be described with reference to FIG. 25. Similarly to the first embodiment, this second embodiment also adopts the shared bit line system and, moreover, has the two NAND cell units NUiR and NUiL shared by one bit line BLi connected alternately.

However, in this second embodiment, the NAND cell unit NUiR connected to one bit line BLi is connected to the source line CELSRC1 or CELSRC2 via a source line contact CS which is identical to that of the NAND cell unit NUi+1R connected to the bit line BLi+1 adjacent to this NAND cell unit NUiR. In this respect, the second embodiment differs from the first embodiment. Therefore, in the memory cell array 1 of this second embodiment, two NAND cell units connected to a bit line BL in the first portion of the block BLK and two NAND cell units connected to a bit line BL in the second portion of the block BLK are arranged alternately in the row direction. This is also a feature of the second embodiment when compared to the first embodiment.

(Layout Structure and Cross-Sectional Structure)

Figure 26:
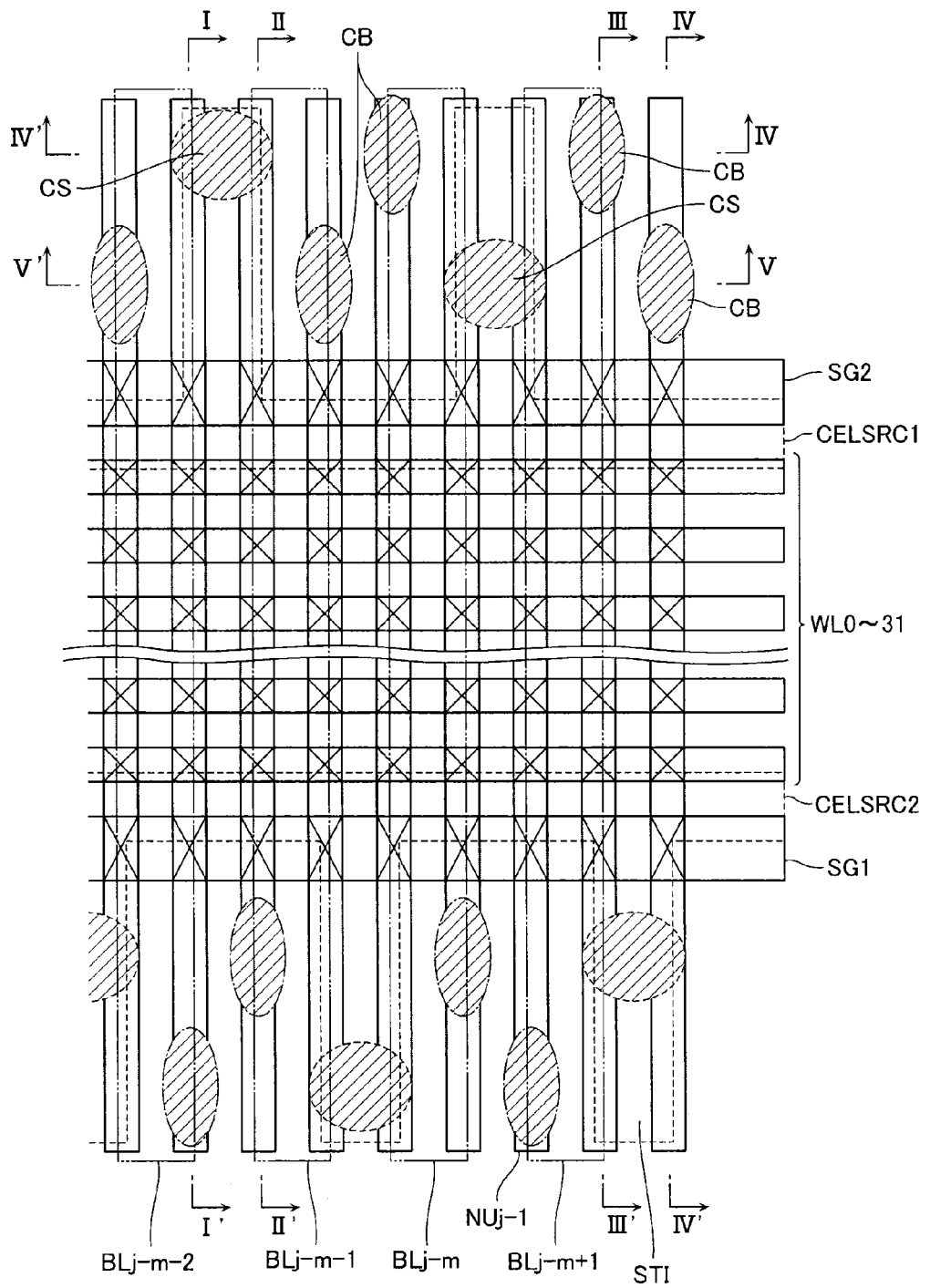
FIG. 26 is a planar surface layout view of one block BLK in the memory cell array 1 of the second embodiment.
Figure 27:
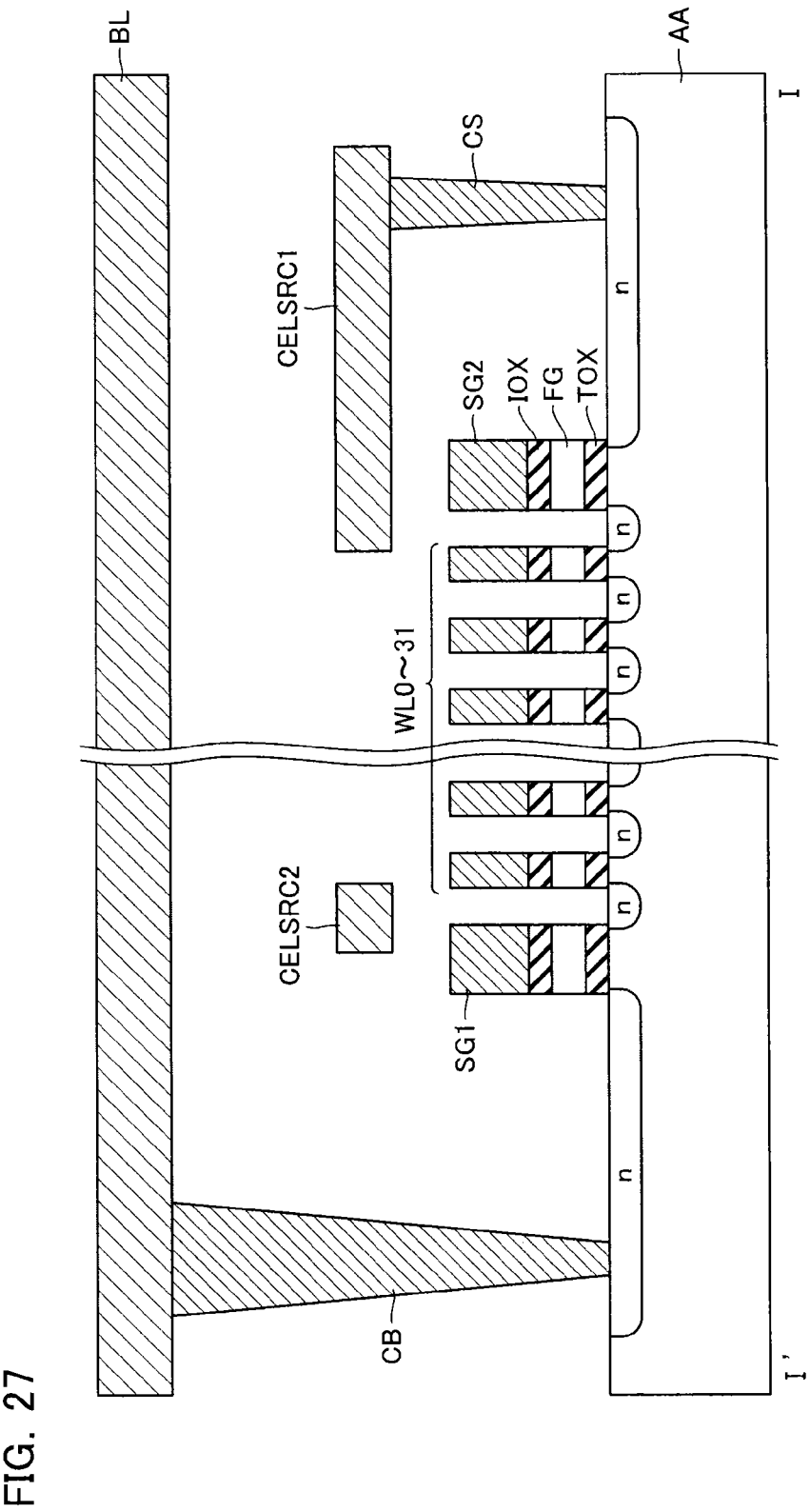
FIG. 27 is a cross-sectional view taken along the line I-I' in FIG. 26.
Figure 28:
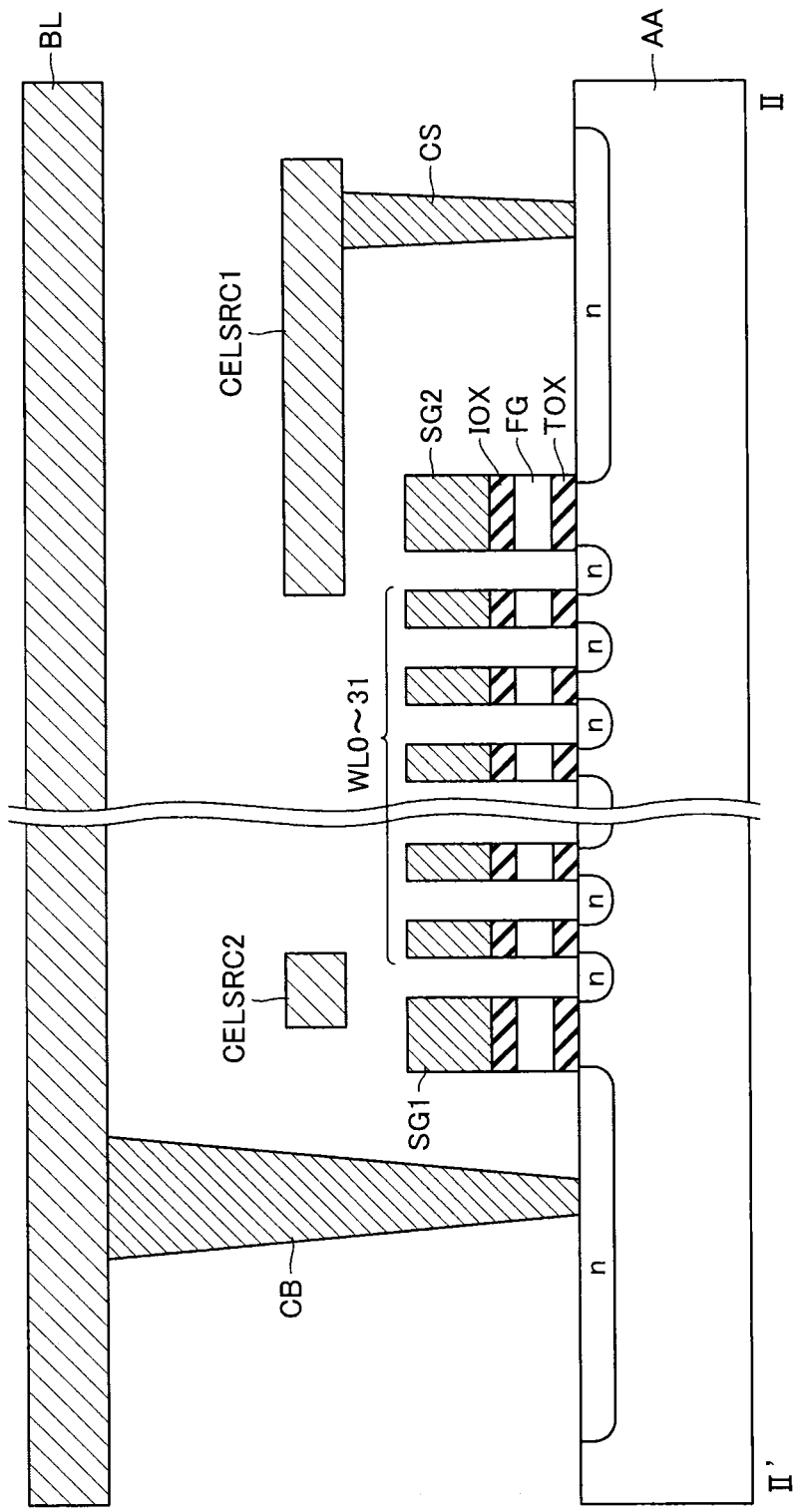
FIG. 28 is a cross-sectional view taken along the line II-II' in FIG. 26.
Figure 29:
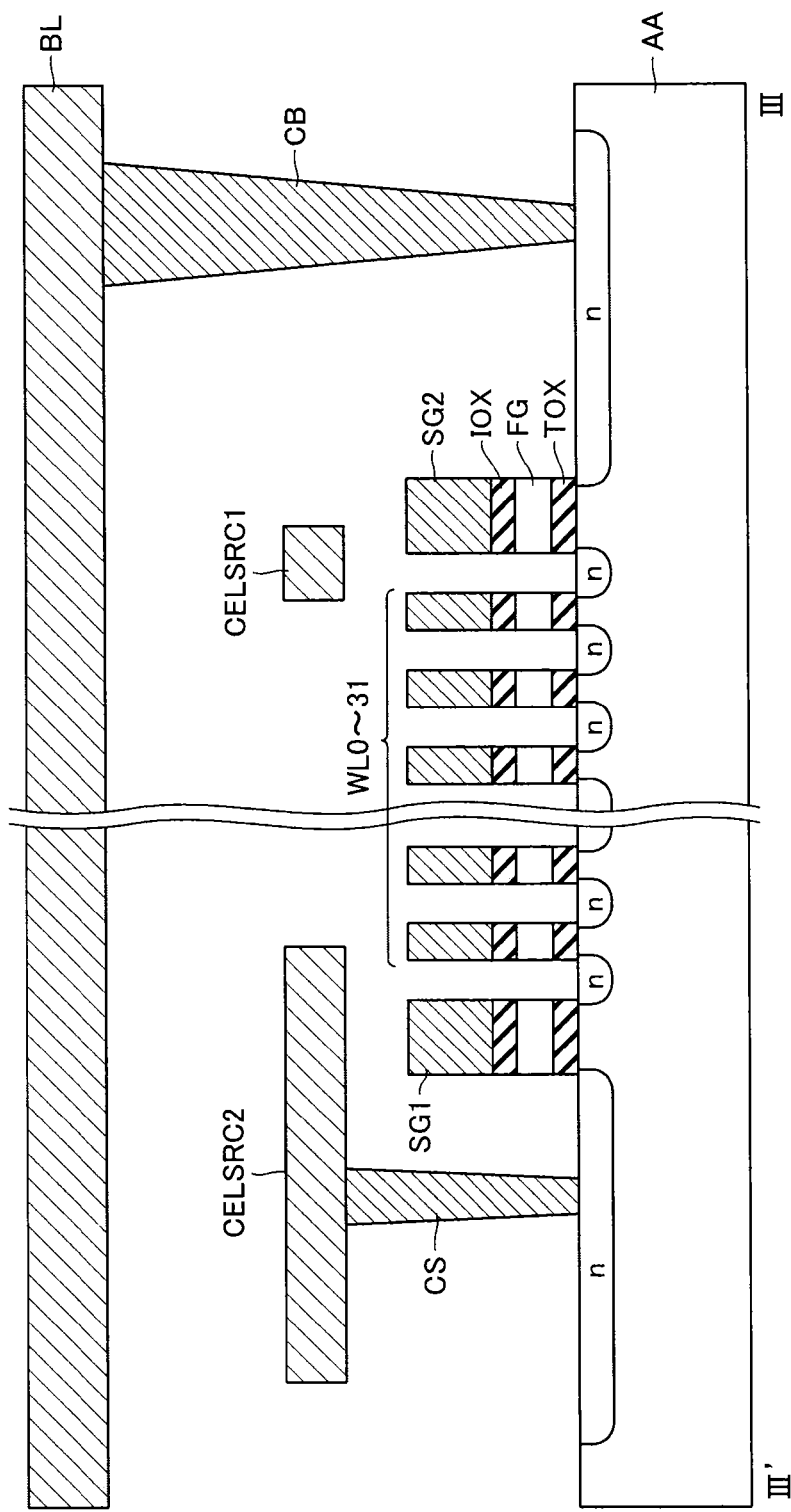
FIG. 29 is a cross-sectional view taken along the line in FIG. 26.
Figure 30:
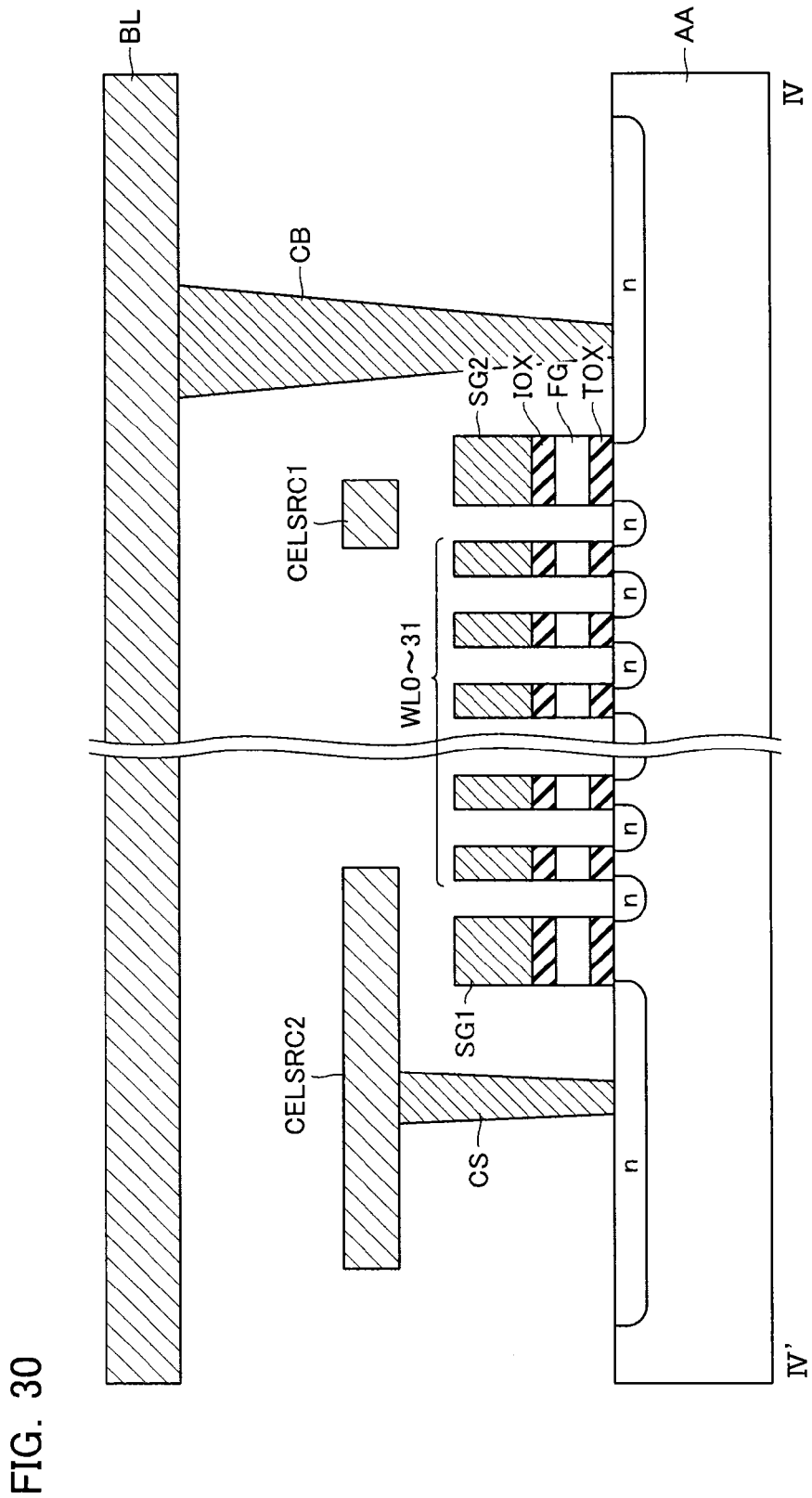
FIG. 30 is a cross-sectional view taken along the line IV-IV' in FIG. 26.
Figure 31:
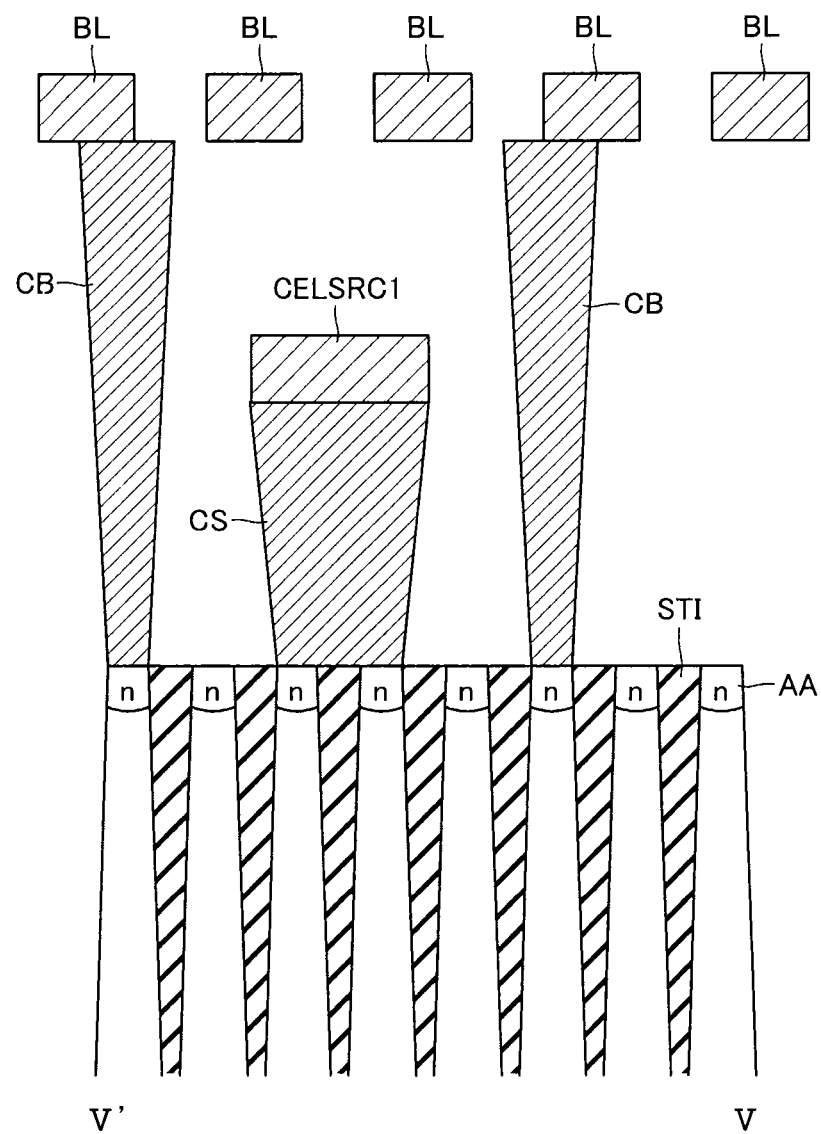
FIG. 31 is a cross-sectional view taken along the line V-V' in FIG. 26.
Figure 32:
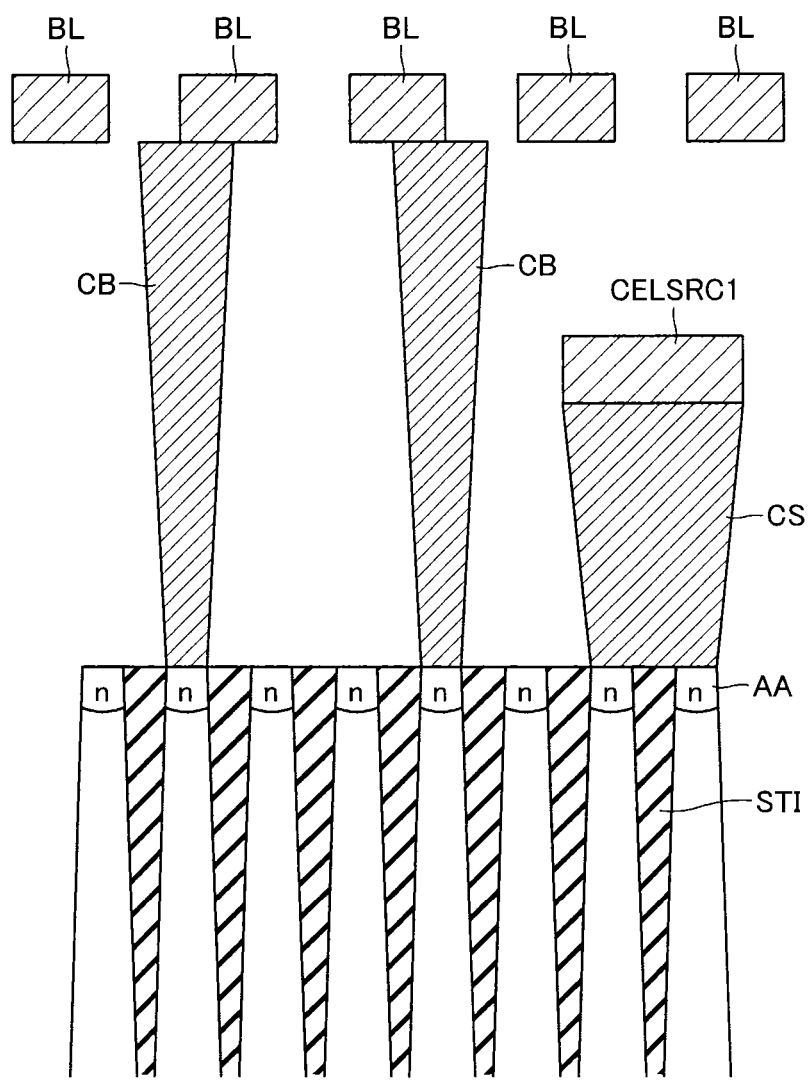
FIG. 32 is a cross-sectional view taken along the line VI-VI' in FIG. 26.

Next, an actual structure of the memory cell array in the second embodiment will be described with reference to FIGS. 26 to 32. FIG. 26 is a planar surface layout view of one block BLK in the memory cell array 1 of this embodiment. In addition, FIGS. 27 to 32 are cross-sectional views taken along the lines I-I', II-II', III-III', IV-IV', V-V', and VI-VI', respectively, in FIG. 26. In FIGS. 26 to 32, structures identical to those in the first embodiment are assigned with symbols identical to those assigned in the first embodiment, and a detailed description of such structures is omitted below.

The difference with the first embodiment is arrangement of the contacts CB and CS. In this second embodiment, two bit line contacts CB and one source line contact CS formed straddling two bit lines BL appear alternately in the row direction. This is different to the first embodiment (FIG. 3), where one bit line contact CB and one source line contact CS appear alternately in the row direction.

Moreover, in this second embodiment, a structure of the source lines CELSRC1 and CELSRC2 is different from that in the first embodiment. The source lines CELSRC1 and CELSRC2 of the first embodiment have a simple striped structure extending in the row direction. In contrast, the source lines CELSRC1 and CELSRC2 of the second embodiment have a comb tooth shape as shown in FIG. 26. That is, the source lines CELSRC1 and CELSRC2 include a base line portion extending in the row direction and a plurality of comb tooth portions extending from that base line portion. The comb tooth portions are each connected to a source line contact CS.

(Various Kinds of Operations)

The threshold voltage change operation of the select transistors S1 and S2, the write verify operation of that threshold voltage change operation, and the read operation, the write operation, and the erase operation of the memory cell MC in the second embodiment are identical to those in the first embodiment.

[Advantages]

This second embodiment allows identical advantages to those of the first embodiment to be obtained. Additionally, in this second embodiment, since adjacent NAND cell units share an identical contact CS, array pitch of the contact can be relaxed compared to in the first embodiment, thereby allowing yield to be improved. Moreover, the need to increase a staggering position from two columns to three columns, and so on, during miniaturization is removed, thereby allowing cell array area to be reduced.

[Third Embodiment]

Figure 33:
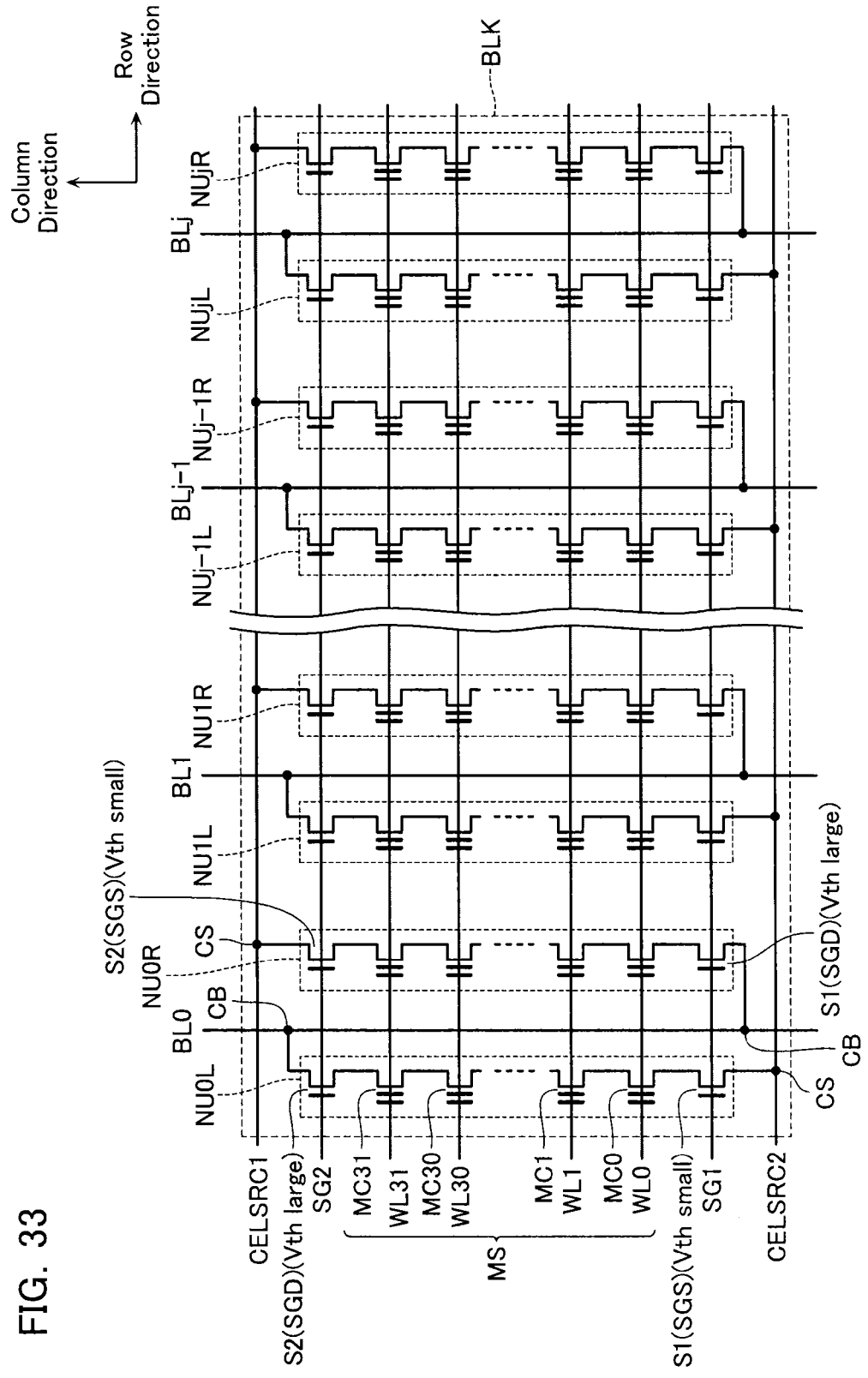
FIG. 33 is a circuit diagram of one block BLK in a memory cell array 1 of a nonvolatile semiconductor memory device according to a third embodiment.

Next, a nonvolatile semiconductor memory device according to a third embodiment will be described with reference to FIG. 33. The nonvolatile semiconductor memory device of this embodiment has an overall configuration which is similar to that of the first embodiment, excluding a circuit configuration in the memory cell array 1.

Below, a circuit diagram of one block BLK in the memory cell array 1 of the third embodiment will be described with reference to FIG. 33. In the memory cell array 1 of the previously described embodiments, the select transistors S1 and S2 have an identical structure to the memory cell MC and are configured to be rewritable in a nonvolatile manner. In contrast, the select transistors S1 and S2 of the present embodiment have an identical structure to an ordinary MOS transistor and are not rewritable. In this respect, the present embodiment differs from the first embodiment. However, a threshold voltage Vths1R of the select transistor S1 in the NAND cell unit NUiR is large compared to a threshold voltage Vths1L of the select transistor S1 in the NAND cell unit NUiL. Moreover, the select transistor S2 in the NAND cell unit NUiL has a larger threshold voltage compared to the select transistor S2 in the NAND cell unit NUiR. These transistors are provided with such differing threshold voltages by, for example, changing an amount of ion implantation to the channel portion.

[Advantages]

This third embodiment allows identical advantages to those of the first embodiment to be obtained. This embodiment makes the threshold voltage change operation of the select transistors S1 and S2 in the first and second embodiments unnecessary, hence allows operation time to be reduced compared to the first and second embodiments.

[Fourth Embodiment]

Figure 34:
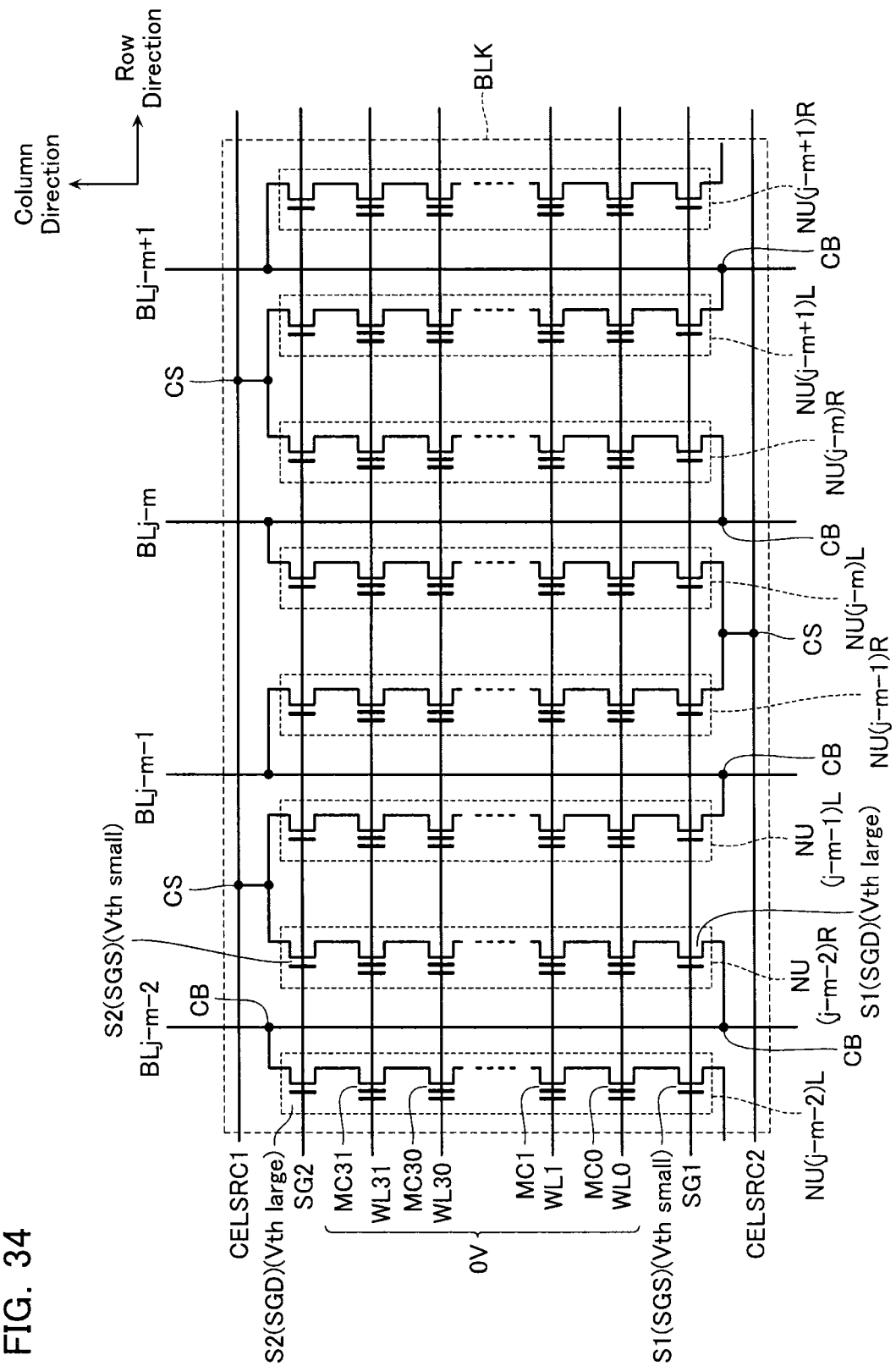
FIG. 34 is a circuit diagram of one block BLK in a memory cell array 1 of a nonvolatile semiconductor memory device according to a fourth embodiment.

Next, a nonvolatile semiconductor memory device according to a fourth embodiment will be described with reference to FIG. 34. The nonvolatile semiconductor memory device of this embodiment has an overall configuration which is similar to that of the first embodiment, excluding a circuit configuration in the memory cell array 1. Moreover, a circuit configuration of one block BLK in the memory cell array 1 closely resembles that of the second embodiment (FIG. 25).

Below, a circuit diagram of one block BLK in the memory cell array 1 of the fourth embodiment will be described with reference to FIG. 34. Similarly to the third embodiment, the select transistors S1 and S2 of this fourth embodiment also have an identical structure to an ordinary MOS transistor and are not rewritable. However, the select transistor S1 in the NAND cell unit NUiR has a larger threshold voltage compared to the select transistor S1 in the NAND cell unit NUiL. Moreover, the select transistor S2 in the NAND cell unit NUiL has a larger threshold voltage compared to the select transistor S2 in the NAND cell unit NUiR. These transistors are provided with such differing threshold voltages by changing an amount of ion implantation to the channel portion.

[Advantages]

This fourth embodiment allows identical advantages to those of the first embodiment to be obtained. This embodiment makes the threshold voltage change operation of the select transistors S1 and S2 in the first and second embodiments unnecessary, hence allows operation time to be reduced compared to the first and second embodiments.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array configured having NAND cell units arranged therein, each of the NAND cell units including a memory string and a bit-line-side select transistor and source-line-side select transistor that are connected respectively to the two ends of the memory string, the memory string being configured having a plurality of memory cells connected in series therein, each of the memory cells being configured capable of storing data in a nonvolatile manner;
   word lines extending in a first direction and commonly connected to the memory cells in a plurality of the NAND cell units; and
   bit lines extending in a second direction crossing to the first direction and connected to one ends of the NAND cell units, in one block, both a first and a second NAND cell units being connected to one of the bit lines, the bit-line-side select transistor in the first NAND cell unit and the source-line-side select transistor in the second NAND cell unit being disposed adjacently to each other, and the source-line-side select transistor in the first NAND cell unit and the bit-line-side select transistor in the second NAND cell unit being disposed adjacently to each other.

2. The nonvolatile semiconductor memory device according to claim 1, wherein the bit-line-side select transistor in the first NAND cell unit and the source-line-side select transistor in the second NAND cell unit are commonly connected to a first select gate line, and the source-line-side select transistor in the first NAND cell unit and the bit-line-side select transistor in the second NAND cell unit are commonly connected to a second select gate line.

3. The nonvolatile semiconductor memory device according to claim 2, wherein a bit-line-side transistor of the first NAND cell unit is given a larger threshold voltage compared to the source-line-side select transistor in the second NAND cell unit, and a bit-line-side transistor of the second NAND cell unit is given a larger threshold voltage compared to the source-line-side select transistor in the first NAND cell unit.

4. The nonvolatile semiconductor memory device according to claim 3, further comprising a control circuit configured to execute a read operation on the memory cells, wherein the control circuit is configured to execute a first read operation targeting the first NAND cell unit and a second read operation targeting the second NAND cell unit, in the first read operation, after charging the bit line to a certain voltage, a first voltage is provided to the first select gate line to make the bit-line-side select transistor of the first NAND cell unit and the source-line-side select transistor of the second NAND cell unit conductive, while a second voltage smaller than the first voltage is provided to the second select gate line to set the source-line-side select transistor of the first NAND cell unit to a conductive state and set the bit-line-side select transistor of the second NAND cell unit to a non-conductive state, and in the second read operation, after charging the bit line to a certain voltage, the first voltage is provided to the second select gate line to make the source-line-side select transistor of the first NAND cell unit and the bit-line-side select transistor of the second NAND cell unit conductive, while the second voltage is provided to the first select gate line to set the bit-line-side select transistor of the first NAND cell unit to a non-conductive state and set the source-line-side select transistor of the second NAND cell unit to a conductive state.

5. The nonvolatile semiconductor memory device according to claim 3, further comprising a control circuit configured to execute a write operation on the memory cells, and further comprising a first source line and a second source line, wherein the control circuit is configured to execute a first write operation targeting the first NAND cell unit and a second write operation targeting the second NAND cell unit, the first write operation provides a third voltage or a fourth voltage smaller than the third voltage to the bit line according to a type of data to be written, provides the third voltage to the first select gate line to set the bit-line-side select transistor of the first NAND cell unit to a conductive state or a non-conductive state according to the type of data and, by providing the third voltage to the second source line, sets the source-line-side select transistor of the second NAND cell unit to a non-conductive state, and provides the fourth voltage to the second select gate line to set the source-line-side select transistor of the first NAND cell unit and the bit-line-side select transistor of the second NAND cell unit to a non-conductive state, and the second write operation provides the third voltage or the fourth voltage to the bit line according to a type of data to be written, provides the fourth voltage to the first select gate line to set the bit-line-side select transistor of the first NAND cell unit and the source-line-side select transistor of the second NAND cell unit to a non-conductive state, and provides the third voltage to the second select gate line and the first source line to set the source-line-side select transistor of the first NAND cell unit to a non-conductive state and set the bit-line-side select transistor of the second NAND cell unit to a conductive state or a non-conductive state according to the type of data.

6. The nonvolatile semiconductor memory device according to claim 1, wherein one of the first NAND cell units and one of the second NAND cell units are disposed alternately along the first direction.

7. The nonvolatile semiconductor memory device according to claim 6, further comprising a first source line connected to the first NAND cell unit; and a second source line connected to the second NAND cell unit.

8. The nonvolatile semiconductor memory device according to claim 7, further comprising a bit line contact connecting the first NAND cell unit to the bit line; and a source line contact connecting the second NAND cell unit to the second source line;

wherein the bit line contact and the source line contact are formed alternately along the first direction.

9. The nonvolatile semiconductor memory device according to claim 1, wherein two of the first NAND cell units and two of the second NAND cell units are disposed alternately along the first direction.

10. The nonvolatile semiconductor memory device according to claim 9, further comprising a first source line and a second source line, wherein the two of the first NAND cell units adjacent to each other are connected to the first source line via a common source line contact, and the two of the second NAND cell units adjacent to each other are connected to the second source line via a common source line contact.

11. The nonvolatile semiconductor memory device according to claim 10, further comprising a bit line contact connecting the first NAND cell unit to the bit line, wherein two of the bit line contacts and one of the source line contacts are formed alternately along the first direction.

12. A nonvolatile semiconductor memory device, comprising:

a memory cell array configured having NAND cell units arranged therein, each of the NAND cell units including a memory string and a bit-line-side select transistor and source-line-side select transistor that are connected respectively to the two ends of the memory string, the memory string being configured having a plurality of memory cells connected in series therein, each of the memory cells being configured capable of storing data in a nonvolatile manner;

word lines extending in a first direction and commonly connected to the memory cells in a plurality of the NAND cell units; and bit lines extending in a second direction crossing to the first direction and connected to one ends of the NAND cell units, in one block, both a first and a second NAND cell units being connected to one of the bit lines, the bit-line-side select transistor in the first NAND cell unit and the source-line-side select transistor in the second NAND cell unit being disposed adjacently to each other, and the source-line-side select transistor in the first NAND cell unit and the bit-line-side select transistor in the second NAND cell unit being disposed adjacently to each other, the bit-line-side select transistor and the source-line-side select transistor being configured rewritable.

13. The nonvolatile semiconductor memory device according to claim 12, wherein the bit-line-side select transistor in the first NAND cell unit and the source-line-side select transistor in the second NAND cell unit are commonly connected to a first select gate line, and the source-line-side select transistor in the first NAND cell unit and the bit-line-side select transistor in the second NAND cell unit are commonly connected to a second select gate line.

14. The nonvolatile semiconductor memory device according to claim 13, further comprising a first source line connected to the first NAND cell unit; and a second source line connected to the second NAND cell unit.

15. The nonvolatile semiconductor memory device according to claim 14, further comprising a control circuit configured to execute a write operation on the bit-line-side and source-line-side select transistors, wherein the control circuit is configured to execute a first write operation targeting the bit-line-side select transistor, and a second write operation targeting the source-line-side select transistor, in the first write operation, after providing a fifth voltage to the bit line, providing a sixth voltage to the first source line, and providing a seventh voltage larger than the fifth voltage to the second source line, an eighth voltage larger than the seventh voltage is provided to the first select gate line, and in the second write operation, after providing the fifth voltage to the bit line, providing the seventh voltage to the first source line, and providing the sixth voltage to the second source line, the eighth voltage is provided to the second select gate line.

16. The nonvolatile semiconductor memory device according to claim 14, further comprising a control circuit configured to execute a read operation on the memory cells, wherein the control circuit is configured to execute a first read operation targeting the first NAND cell unit and a second read operation targeting the second NAND cell unit, in the first read operation, after charging the bit line to a certain voltage, a first voltage is provided to the first select gate line to make the bit-line-side select transistor of the first NAND cell unit and the source-line-side select transistor of the second NAND cell unit conductive, while a second voltage smaller than the first voltage is provided to the second select gate line to set the source-line-side select transistor of the first NAND cell unit to a conductive state and set the bit-line-side select transistor of the second NAND cell unit to a non-conductive state, and in the second read operation, after charging the bit line to a certain voltage, the first voltage is provided to the second select gate line to make the source-line-side select transistor of the first NAND cell unit and the bit-line-side select transistor of the second NAND cell unit conductive, and the second voltage is provided to the first select gate line to set the bit-line-side select transistor of the first NAND cell unit to a non-conductive state and set the source-line-side select transistor of the second NAND cell unit to a conductive state.

17. The nonvolatile semiconductor memory device according to claim 14, further comprising a control circuit configured to execute a write operation on the memory cells, wherein the control circuit is configured to execute a first write operation targeting the first NAND cell unit and a second write operation targeting the second NAND cell unit, the first write operation provides a third voltage or a fourth voltage smaller than the third voltage to the bit line according to a type of data to be written, provides the third voltage to the first select gate line to set the bit-line-side select transistor of the first NAND cell unit to a conductive state or a non-conductive state according to the type of data and, by providing the third voltage to the second source line, sets the source-line-side select transistor of the second NAND cell unit to a non-conductive state, and provides the fourth voltage to the second select gate line to set the source-line-side select transistor of the first NAND cell unit and the bit-line-side select transistor of the second NAND cell unit to a non-conductive state, and the second write operation provides the third voltage or the fourth voltage to the bit line according to a type of data to be written, provides the fourth voltage to the first select gate line to set the bit-line-side select transistor of the first NAND cell unit and the source-line-side select transistor of the second NAND cell unit to a non-conductive state, and provides the third voltage to the second select gate line and the first source line to set the source-line-side select transistor of the first NAND cell unit to a non-conductive state and set the bit-line-side select transistor of the second NAND cell unit to a conductive state or a non-conductive state according to the type of data.

* * * * *